(12) United States Patent
Lee et al.

(10) Patent No.: US 12,069,843 B2
(45) Date of Patent: Aug. 20, 2024

(54) DISPLAY DEVICE

(71) Applicant: LG ELECTRONICS INC., Seoul (KR)

(72) Inventors: Jaegi Lee, Seoul (KR); Jungyul Sakong, Seoul (KR); Junseung Kim, Seoul (KR); Boreum Lee, Seoul (KR); Jaecheol Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 138 days.

(21) Appl. No.: 17/758,436

(22) PCT Filed: Oct. 14, 2020

(86) PCT No.: PCT/KR2020/014032
§ 371 (c)(1),
(2) Date: Jul. 6, 2022

(87) PCT Pub. No.: WO2021/141214
PCT Pub. Date: Jul. 15, 2021

(65) Prior Publication Data
US 2023/0021970 A1  Jan. 26, 2023

(30) Foreign Application Priority Data

Jan. 6, 2020 (KR) ........................ 10-2020-0001645

(51) Int. Cl.
*H05K 7/20* (2006.01)
*H05K 5/03* (2006.01)

(52) U.S. Cl.
CPC ........... *H05K 7/20963* (2013.01); *H05K 5/03* (2013.01)

(58) Field of Classification Search
CPC ............................ H05K 7/20963; H05K 5/03
See application file for complete search history.

(56) References Cited

U.S. PATENT DOCUMENTS 5,164,542 A * 11/1992 Hart ...................... G06F 1/1626
361/679.02
D353,133 S * 12/1994 Yamada ...................... D14/325
(Continued)

FOREIGN PATENT DOCUMENTS

JP            09190156         7/1997
KR        1020170119344      10/2017
(Continued)

OTHER PUBLICATIONS

PCT International Application No. PCT/KR2020/014032, International Search Report dated Mar. 29, 2021, 3 pages.

*Primary Examiner* — Adrian S Wilson
(74) *Attorney, Agent, or Firm* — LEE, HONG, DEGERMAN, KANG & WAIMEY

(57) ABSTRACT

Disclosed is a display device. The display device of the present disclosure includes a display panel; a corrugate panel located in a rearward direction of the display panel, the corrugate panel including a front skin facing the display panel, a rear skin facing the front skin in a rearward direction of the front skin, and a wave-shaped core located between the front skin and the rear skin; a module cover coupled to the corrugate panel in a rearward direction of the corrugate panel; and a back cover coupled to the module cover in a rearward direction of the module cover.

10 Claims, 32 Drawing Sheets

(56) References Cited

U.S. PATENT DOCUMENTS

| | | | |
|---|---|---|---|
| 8,879,249 B1* | 11/2014 | Wanderman | G06F 1/1656 |
| | | | 361/679.55 |
| 9,569,018 B2* | 2/2017 | Kang | G06F 3/03 |
| 9,591,773 B2* | 3/2017 | Shin | H05K 5/0204 |
| 10,219,409 B2* | 2/2019 | Basu | H05K 7/20336 |
| 2006/0245214 A1* | 11/2006 | Kim | F28D 15/0275 |
| | | | 362/561 |
| 2008/0257586 A1* | 10/2008 | Chen | H05K 1/0283 |
| | | | 29/829 |
| 2009/0009974 A1* | 1/2009 | Tseng | G02F 1/133382 |
| | | | 361/711 |
| 2013/0063899 A1* | 3/2013 | Kuroda | H01L 23/433 |
| | | | 361/718 |
| 2014/0070680 A1* | 3/2014 | Kawada | B22D 17/00 |
| | | | 164/113 |
| 2015/0049434 A1* | 2/2015 | Sato | G06F 1/1626 |
| | | | 361/679.56 |
| 2016/0212835 A1* | 7/2016 | Müeller | H05K 7/20854 |
| 2017/0090240 A1* | 3/2017 | Liu | G02F 1/133382 |
| 2017/0359909 A1* | 12/2017 | Lee | H05K 5/0017 |

FOREIGN PATENT DOCUMENTS

| KR | 1020170134153 | 12/2017 |
|---|---|---|
| KR | 1020170139829 | 12/2017 |
| KR | 1020190076284 | 7/2019 |

\* cited by examiner

DISPLAY DEVICE

CROSS-REFERENCE TO RELATED APPLICATION(S)

This application is the National Stage filing under 35 U.S.C. 371 of International Application No. PCT/KR2020/014032, filed on Oct. 14, 2020, which claims the benefit of earlier filing date and right of priority to Korean Application No. 10-2020-0001645, filed on Jan. 6, 2020, the contents of which are all incorporated by reference herein in their entirety.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), Vacuum Fluorescent Display (VFD), and Organic Light Emitting Diode (OLED) have been researched and used in recent years.

Among them, a display device using an organic light emitting diode (OLED) has superior luminance and viewing angle compared to a liquid crystal display device, and can be implemented in an ultra-thin shape as it does not require a backlight unit.

Recently, many studies have been accomplished on a structure for securing rigidity of a large-screen ultra-thin display device and dissipating heat according to high quality.

DISCLOSURE

Technical Problem

An object of the present disclosure is to solve the above and other problems.

Another object may be to secure a structural rigidity of a large-screen ultra-thin display device.

Another object may be to provide a display device having a heat dissipation structure capable of dissipating heat due to high image quality.

Technical Solution

According to an aspect of the present disclosure for achieving the above objects, provided is a display device including: a display panel; a corrugate panel located in a rearward direction of the display panel, the corrugate panel including a front skin facing the display panel, a rear skin facing the front skin in a rearward direction of the front skin, and a wave-shaped core located between the front skin and the rear skin; a module cover coupled to the corrugate panel in a rearward direction of the corrugate panel; and a back cover coupled to the module cover in a rearward direction of the module cover, wherein the back cover includes: a first piece covering a portion of a rear surface of the module cover; a second piece which is adjacent to the first piece and covers a remainder of the rear surface of the module cover; and a third piece coupled to the first and second pieces in a rearward direction of the first and second pieces.

Advantageous Effects

The effect of the display device according to the present disclosure will be described as follows.

According to at least one of the embodiments of the present disclosure, it is possible to secure a structural rigidity of a large-screen ultra-thin display device.

According to at least one of the embodiments of the present disclosure, it is possible to provide a display device having a heat dissipation structure capable of dissipating heat due to high image quality.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

MODE FOR INVENTION

Figure 1:
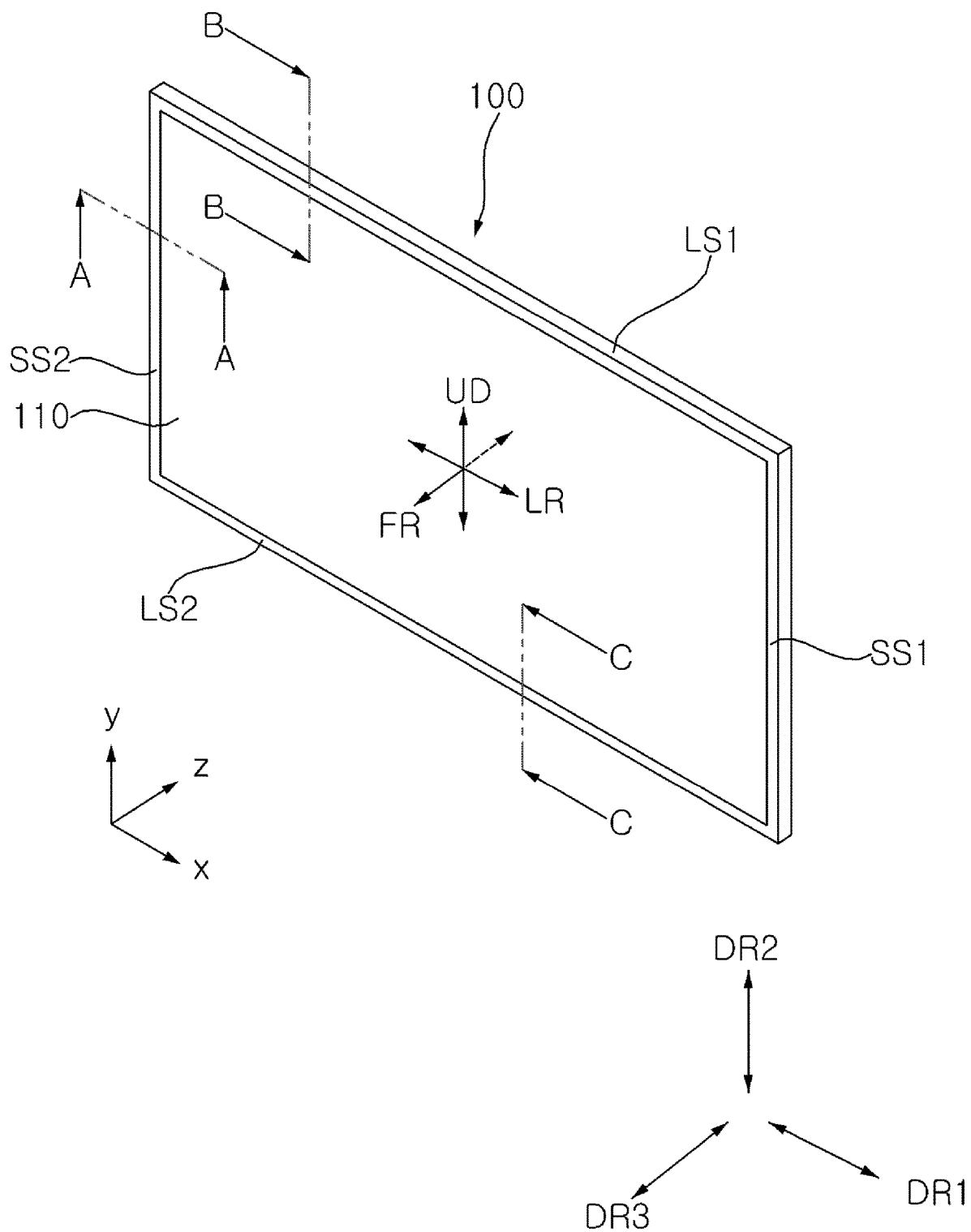
FIGS. 1 to 32 are diagrams illustrating examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

Even if the embodiment is described with reference to specific drawings, if necessary, reference numerals not appearing in the specific drawings may be referred to, and reference numerals not appearing in the specific drawings are used in a case where the above reference numerals appear in the other figures.

Referring to FIG. 1, a display device 100 may include a display panel 110. The display panel 110 may display a screen.

The display device 100 may include a first long side LS1, a second long side LS2 facing the first long side LS1, a first short side SS1 adjacent to the first long side LS1 and the second long side LS2, and a second short side SS2 facing the first short side SS1.

For convenience of explanation, it is illustrated that the lengths of the first and second long sides LS1 and LS2 are longer than the lengths of the first and second short sides SS1 and SS2, but it may be possible that the lengths of the first and second long sides LS1 and LS2 are approximately the same as the lengths of the first and second short sides SS1 and SS2.

A direction parallel to the long sides LS1 and LS2 of the display device 100 may be referred to as a first direction DR1 or a left-right direction LR. A direction parallel to the short sides SS1 and SS2 of the display device 100 may be referred to as a second direction DR2 or an up-down direction UD.

A direction perpendicular to the long sides LS1 and LS2 and the short sides SS1 and SS2 of the display device 100 may be referred to as a third direction DR3 or a front-rear direction FR. Here, a direction in which the display panel 110 displays a screen may be referred to as a forward direction, and a direction opposite to this may be referred to as a rearward direction.

Hereinafter, a display panel using an organic light emitting diode (OLED) will be described as an example for the display panel 110, but the display panel 110 applicable to the present disclosure is not limited thereto.

The display panel 110 forms the front surface of the display device 100 and may display an image in a forward direction. The display panel 110 may divide an image into a plurality of pixels and output an image by matching color, brightness, and saturation for each pixel. The display panel 110 may be divided into an active area in which an image is displayed and a de-active area in which an image is not displayed. The display panel 110 may generate light corresponding to a color of red, green, or blue according to a control signal.

Figure 2:
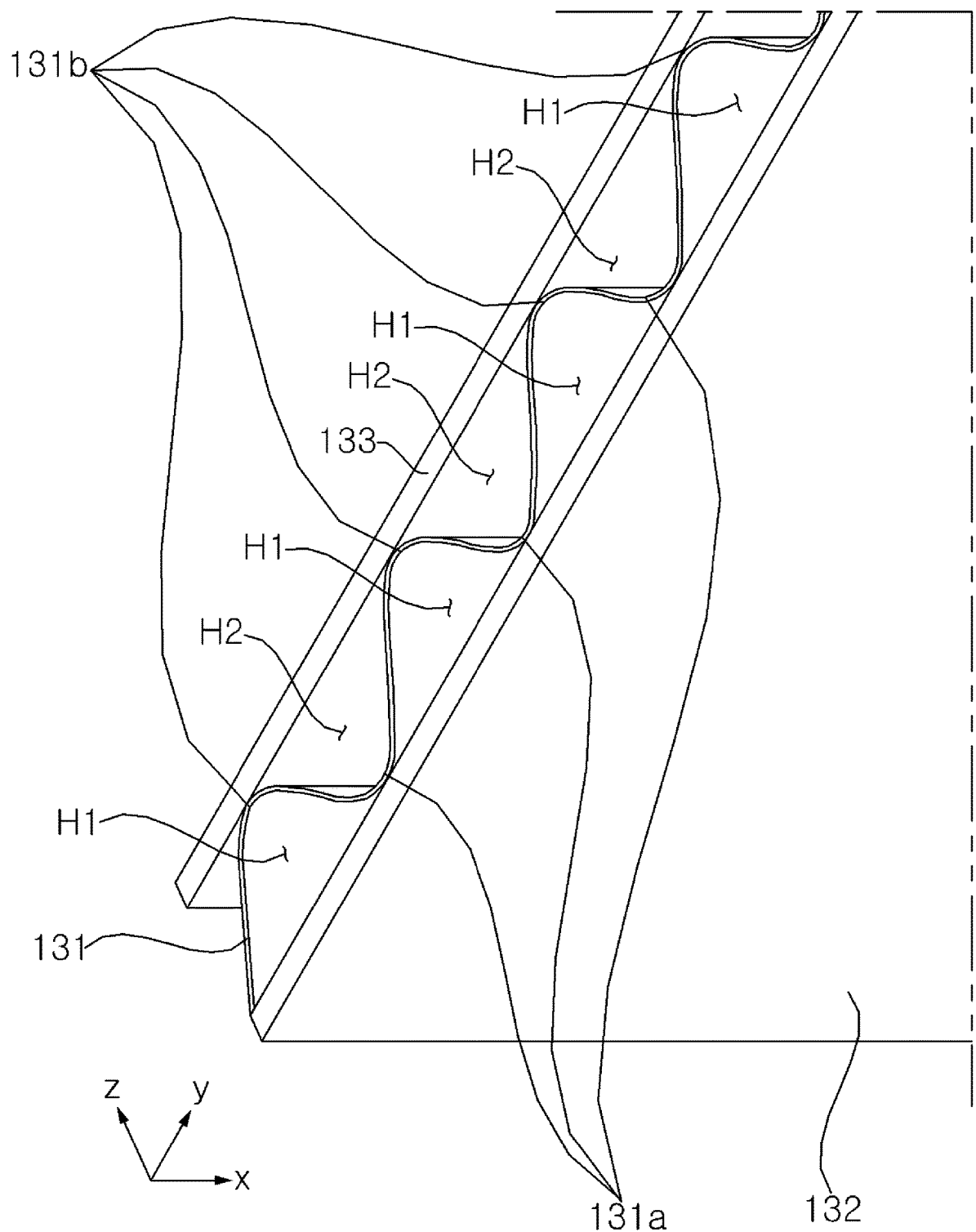

Referring to FIG. 2, a corrugate panel 130 may include a core 131, a front skin 132, and a rear skin 133. The core 131, the front skin 132, and the rear skin 133 may be coupled to each other.

The front skin 132 may form the front surface of the corrugate panel 130. The rear skin 133 may form a rear surface of the corrugate panel 130. The front skin 132 and the rear skin 133 may include a metal material. For example, the front skin 132 and the rear skin 133 may include an aluminum (Al) material. For example, the thickness of the front skin 132 and the rear skin 133 may be about 0.5 mm. The front skin 132 and the rear skin 133 may face each other with respect to the core 131 described later.

The core 131 may be located between the front skin 132 and the rear skin 133. The shape of the core 131 may be a corrugate shape in which elongated ridge 131a and groove 131b are alternately formed. For example, the core 131 may be formed in a wrinkled shape in a wavy shape. For example, the thickness of the core 131 may be about 0.15 mm.

For example, the ridge 131a and the groove 131b may extend long in a left-right direction LR which is a direction in which the display panel 110 extends long. Here, a direction in which the ridge 131a and the groove 131b are extended may be defined as a length direction of the core 131. In this case, a plurality of ridges 131a may be spaced apart from each other in the up-down direction UD. In addition, a plurality of grooves 131b may be spaced apart from each other in the up-down direction UD while being spaced apart from the ridge 131a. For example, a pitch that is a length between the plurality of ridges 131a or a length between the plurality of grooves 131b may be about 7 mm. In addition, the height of the ridge 131a or the groove 131b may be about 3 mm.

For example, the ridge 131a may contact the inner surface of the front skin 132, and the groove 131b may contact the inner surface of the rear skin 133. In contrast, it is also possible that the ridge 131a contacts the inner surface of the rear skin 133 and the groove 131b contacts the inner surface of the front skin 132.

A first hole H1 may be formed between the core 131 and the front skin 132. The first hole H1 may include a plurality of first holes H1 which are spaced apart from each other, with each of the plurality of ridges 131a interposed therebetween. A second hole H2 may be formed between the core 131 and the rear skin 133. The second hole H2 may include a plurality of second holes H2 which are spaced apart from each other, with each of the plurality of grooves 131b interposed therebetween. The first and second holes H1 and H2 may extend long in the left-right direction LR. The first and second holes H1 and H2 may penetrate the left and right surfaces of the corrugate panel 130.

Accordingly, the bending rigidity and/or the torsional rigidity of the display device may be improved.

Figure 3:
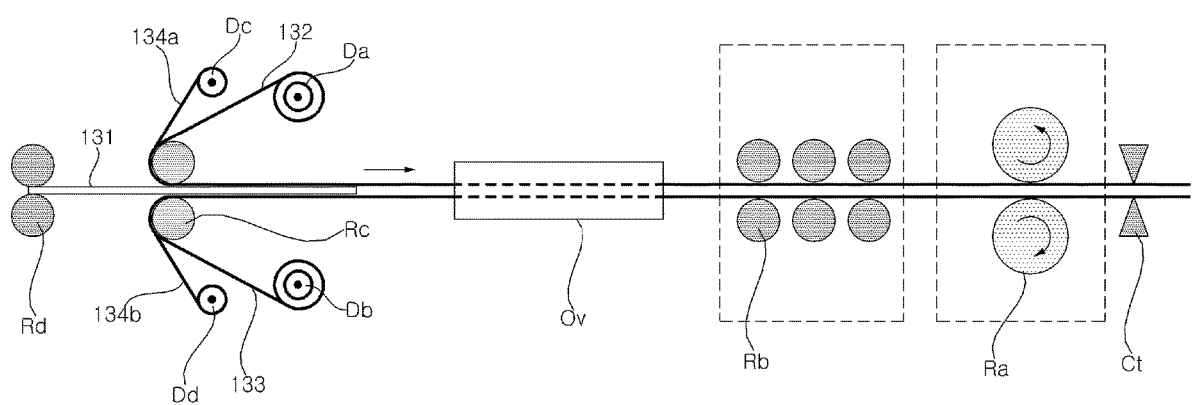
Figure 4:
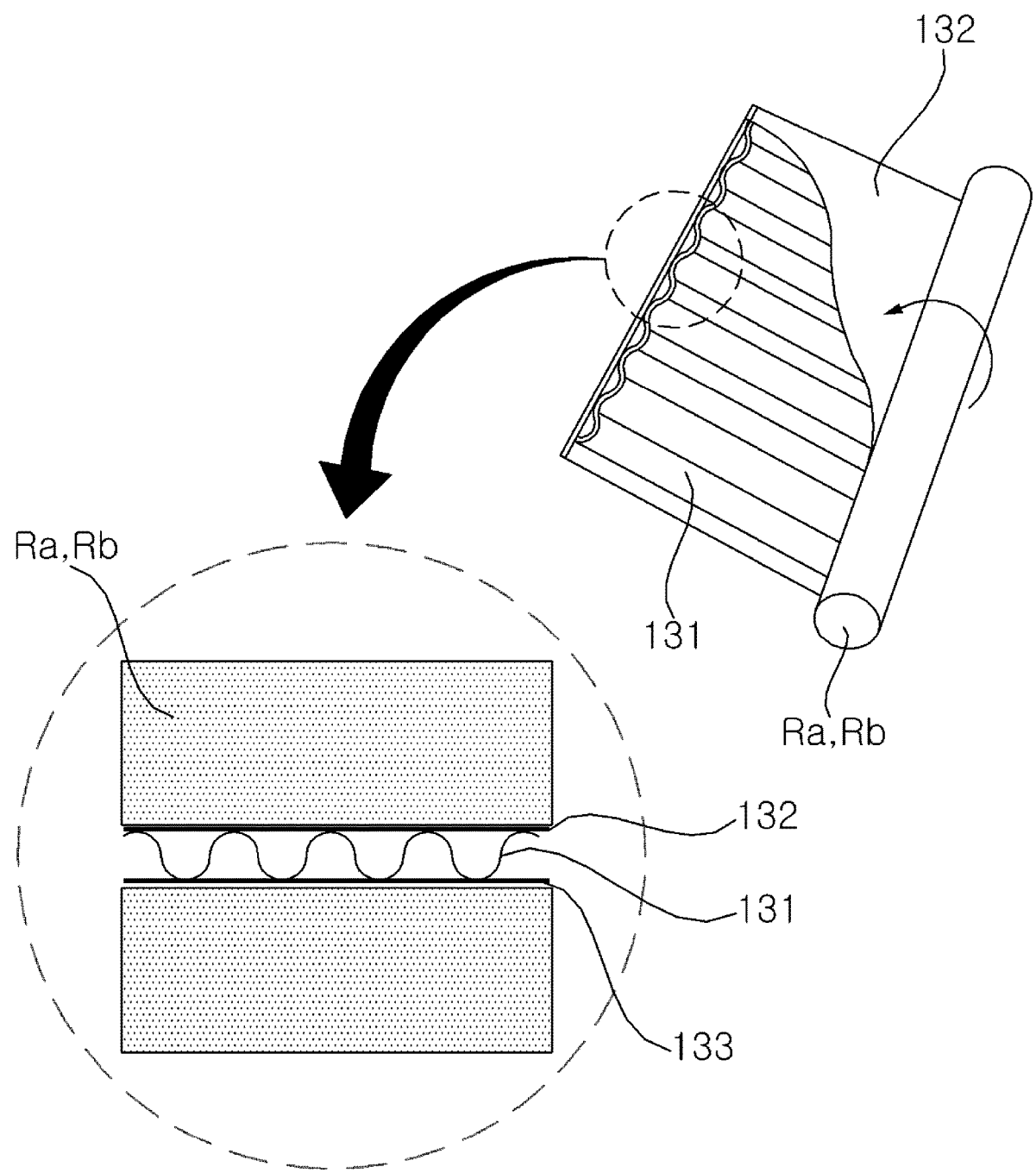

Referring to FIGS. 3 and 4, the corrugate panel 130 may be manufactured through a process of pressing the front skin 132 and the rear skin 133 to the core 131 by using a plurality of rollers, and such a process may be referred to as a roll-to-roll (R2R) process.

Referring to FIG. 3, according to the rotation of a pinch roller (Ra) performing the function of a driving motor, the front skin 132 is unwound from a front drum Da, the rear skin 133 is unwound from a rear drum Db, and the core 131 may be moved through a feeding roller Rd. In addition, a first adhesive 134a for bonding the front skin 132 to the core 131 may be released from a first drum Dc. In addition, a second adhesive 134b for bonding the rear skin 133 to the core 131 may be released from a second drum Db. In this case, the front skin 132, the first adhesive 134a, the core 131, the second adhesive 134b, and the rear skin 133 are stacked in the above order, and may be guided in the direction toward an oven Ov by a guide roller Rc.

The first and second adhesives 134a and 134b may be melted in the oven Ov, and each of the front skin 132 and the rear skin 133 may be bonded to the core 131. That is, the first and second adhesives 134a and 134b may be a hot-melt adhesive. For example, the melting point of the first and second adhesives 134a and 134b may be about 150° C., and the ambient temperature of the oven Ov may be about 200° C. For example, the peel-off force of the first and second adhesives 134a and 134b may be about 10 kgf or more.

The front skin 132, the core 131, and the rear skin 133 that have passed through the oven Ov may be guided to a pressing roller Rb according to the rotation of the pinch roller Ra, and compressed by the pressing roller Rb. Accordingly, the coupling force between the front skin 132, the core 131, and the rear skin 133 may be further increased. The front skin 132, the core 131, and the rear skin 133 coupled to each other may pass the pinch roller Ra, and then be cut by a cutter Ct to be manufactured as a corrugate panel 130 of a certain size.

Referring to FIG. 4, the pressing roller Rb or the pinch roller Ra may contact the outer surface of each of the front skin 132 and the rear skin 133. The pressing roller Rb or the pinch roller Ra may extend long in a direction (e.g. the up-down direction UD) in which the ridge 131a and the groove 131b of the core 131 are alternately formed. That is, when the pressing roller Rb or the pinch roller Ra rotates, the corrugate panel 130 may move in the length direction (i.e. the left-right direction LR) of the core 131.

In this case, the front skin 132 and the rear skin 133 may be sequentially coupled from one end of the core 131 to the other end, in the length direction of the core 131. In this case, the force applied by the pressing roller Rb or the pinch roller Ra may be evenly distributed over all of the plurality of ridges 131a or the plurality of grooves 131b. Accordingly, it is possible to prevent the front skin 132 and the rear skin 133 passing through the pressing roller Rb or the pinch roller Ra from being recessed to the inner side toward the core 131.

In addition, the front skin 132 and the rear skin 133 of the corrugate panel 130 may be formed to be flat. That is, since the rear surface of the rear skin 133 forming the rear surface of the display device 100 is formed to be flat, the appearance may be beautiful per se. In addition, it may be easy to perform additional operations such as painting or attaching sheet paper on the rear surface of the rear skin 133 for an aesthetically pleasing appearance.

In comparison, the pressing roller Rb or the pinch roller Ra may extend long in the length direction (e.g. left-right direction LR) of the ridge 131a and the groove 131b of the core 131. That is, when the pressing roller Rb or the pinch roller Ra rotates, the corrugate panel 130 may move in a direction perpendicular to the length direction of the core 131.

In this case, the front skin 132 and the rear skin 133 may be sequentially coupled from one end of the core 131 to the other end, in a direction perpendicular to the length direction of the core 131. In this case, the force applied by the pressing roller Rb or the pinch roller Ra may be individually applied to each of the plurality of ridges 131a or the plurality of grooves 131b.

Accordingly, the front skin 132 and the rear skin 133 passing through the pressing roller Rb or the pinch roller Ra may be recessed, in particular, in a portion where the first and second holes H1 and H2 are formed, to the inner side. In addition, the front skin 132 and the rear skin 133 of the corrugate panel 130 may not be flat but may be formed unevenly.

Meanwhile, in addition to forming the front skin 132 and the rear skin 133 to be flat through a R2R process described above with reference to FIGS. 3 and 4, it is also possible to form the front skin 132 and the rear skin 133 to be flat through a process in which the front skin 132, the core 131, and the rear skin 133 are sequentially stacked and then coupled.

Figure 5:
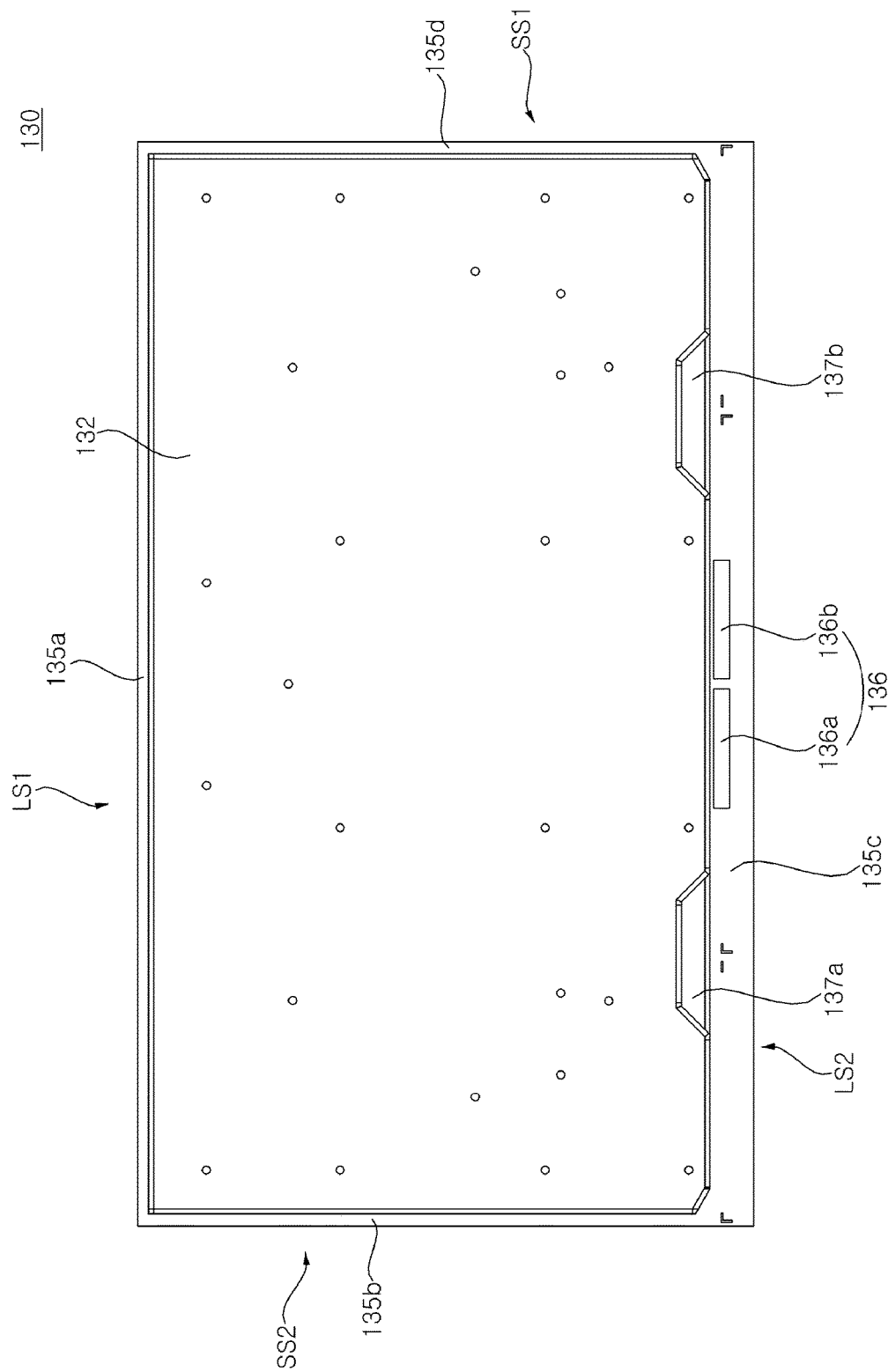

Referring to FIG. 5, the corrugate panel 130 may include a flat portion 130P, an accommodating portion 137a and 137b, and a compression portion 135. The compression portion 135 may be formed around the flat portion 130P. A first compression portion 135a may be formed along the upper side of the flat portion 130P, a second compression portion 135b may be formed along the left side of the flat portion 130P, a third compression portion 135c may be formed along the lower side of the flat portion 130P, and a fourth compression portion 135d may be formed along the right side of the flat portion. The compression portion 135 may be formed while the flat portion 130P is pressed. The compression portion 135 may form a step while being lowered from the flat portion 130P.

A cable hole 136 may be formed to penetrate the front skin 132 (refer to FIG. 2) and the rear skin 133 (refer to FIG. 2) of the third compression portion 135c. The cable hole 136 may be formed in the third compression portion 135c adjacent to the lower side of the flat portion 130P. There may be a plurality of cable holes 136. A first cable hole 136a may be located adjacent to a second cable hole 136b.

The accommodating portion 137 may be formed in the flat portion 130P adjacent to the lower side of the flat portion 130P. There may be a plurality of accommodating portions 137. The first accommodating portion 137a may be located between the first cable hole 136a and the second short side SS2. The second accommodating portion 137b may be located between the second cable hole 136b and the first short side SS1. The accommodating portion 137 may be formed while the flat portion 130P is pressed. The accommodating portion 137 may form a step while being lowered from the flat portion 130P. The accommodating portion 137 may form a step while rising from the compression portion 135.

Figure 6:
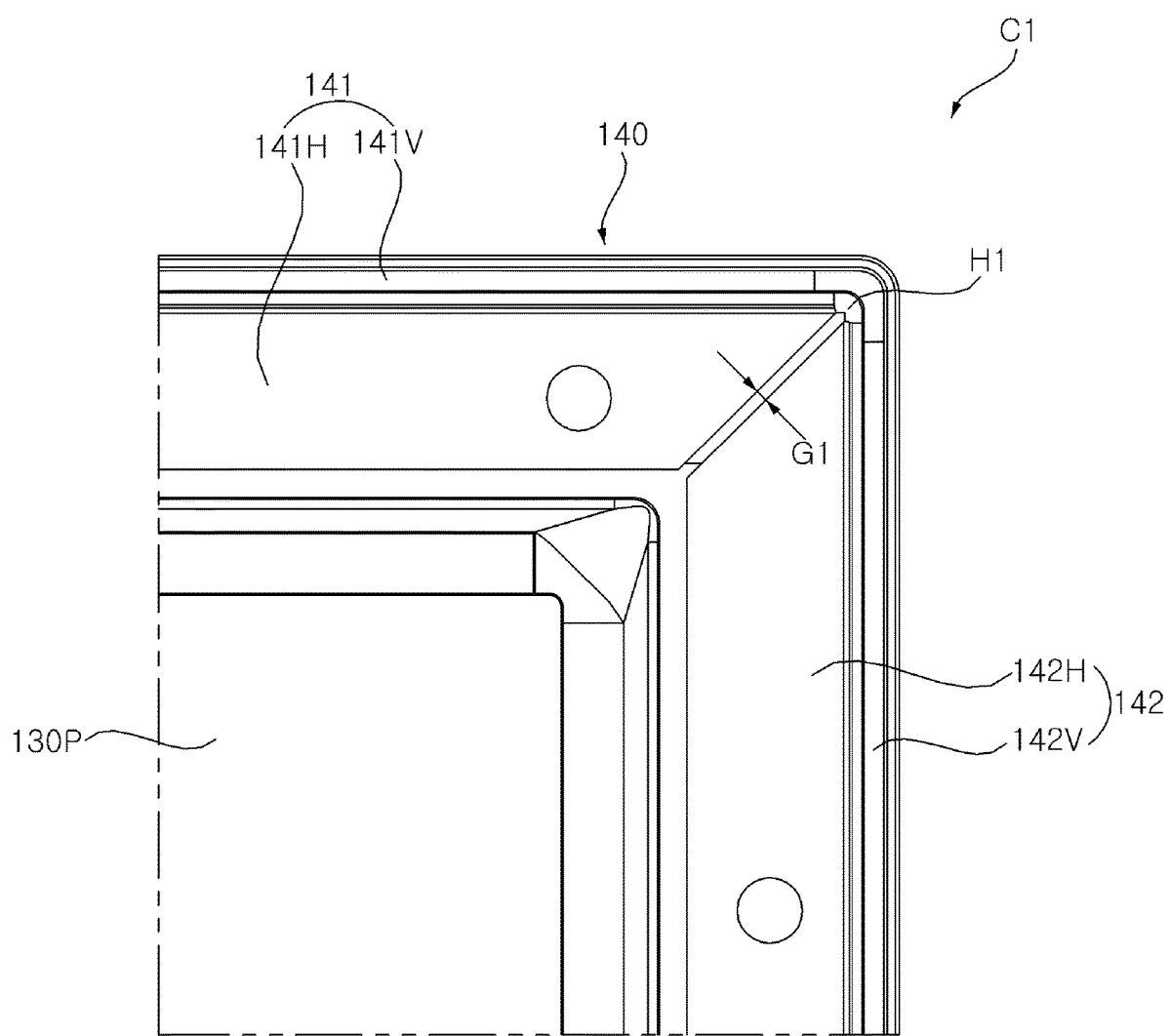
Figure 9:
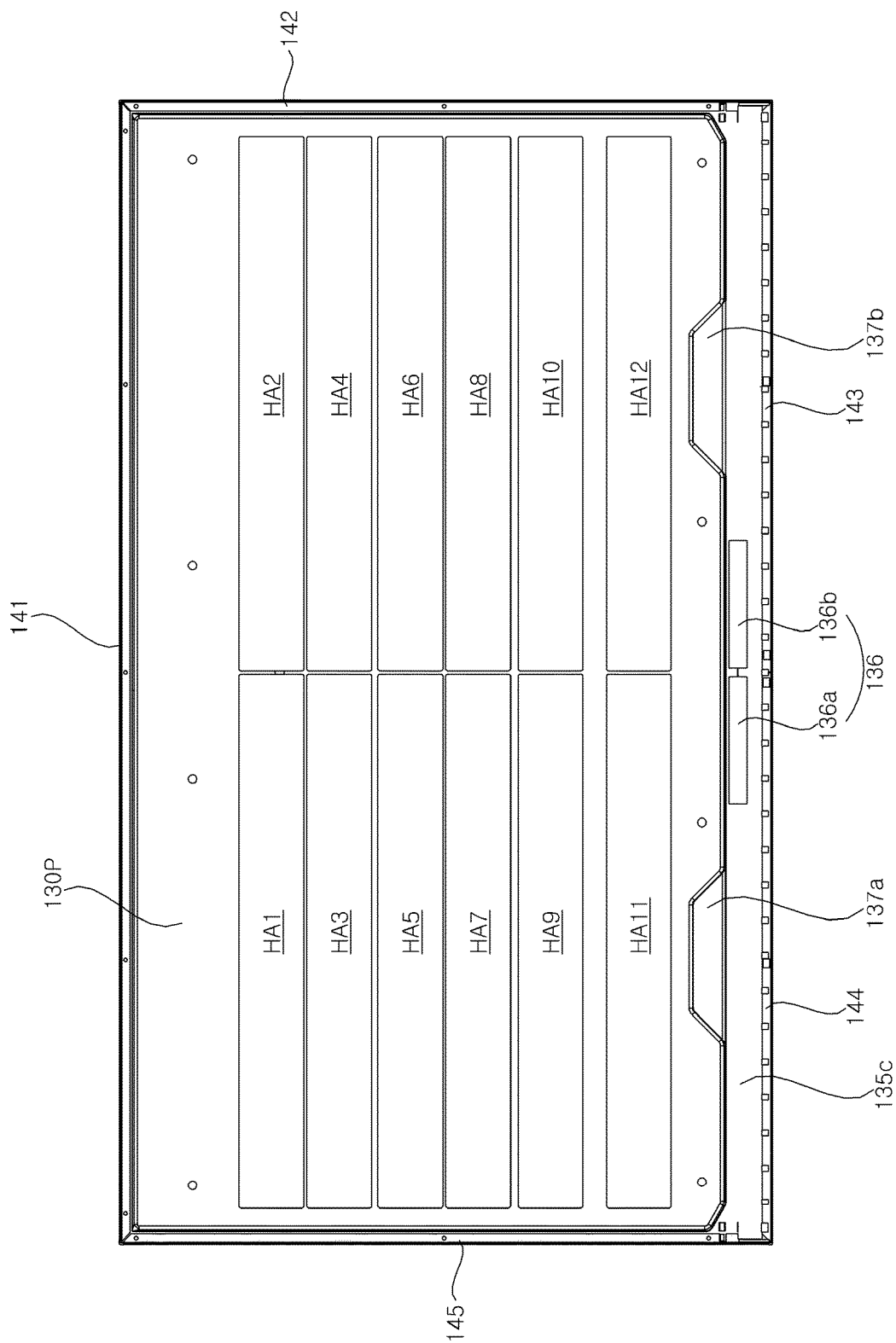

Referring to FIGS. 6 and 9, a side frame 140 may be adjacent to the flat portion 130P and coupled to the compression portion 135 (refer to FIG. 5). The side frame 140 may include a first part 141, a second part 142, a third part 143, a fourth part 144, and a fifth part 145. The second part 142 may be bent at a first corner C1 from the first part 141.

The first part 141 may include a horizontal portion 141H and a vertical portion 141V. The horizontal portion 141H of the first part 141 may be fixed on the first compression portion 135a (refer to FIG. 5). The second part 142 may include a horizontal portion 142H and a vertical portion 142V. The horizontal portion 142H of the second part 142 may be fixed on the fourth compression portion 135d (refer to FIG. 5).

A gap G1 may be formed between the horizontal portion 141H of the first part 141 and the horizontal portion 142H of the second part 142. The vertical portion 141V of the first part 141 and the vertical portion 142V of the second part 142 may be connected while being bent. A hole H1 may be formed between the vertical portions 141V and 142V and the horizontal portions 141H and 142H. The size of the hole H1 or the diameter of the hole H1 may be greater than the width of the gap G1. The description of the first corner C1 of the side frame 140 may be identically applied to the second corner C2 of the side frame 140.

Figure 7:
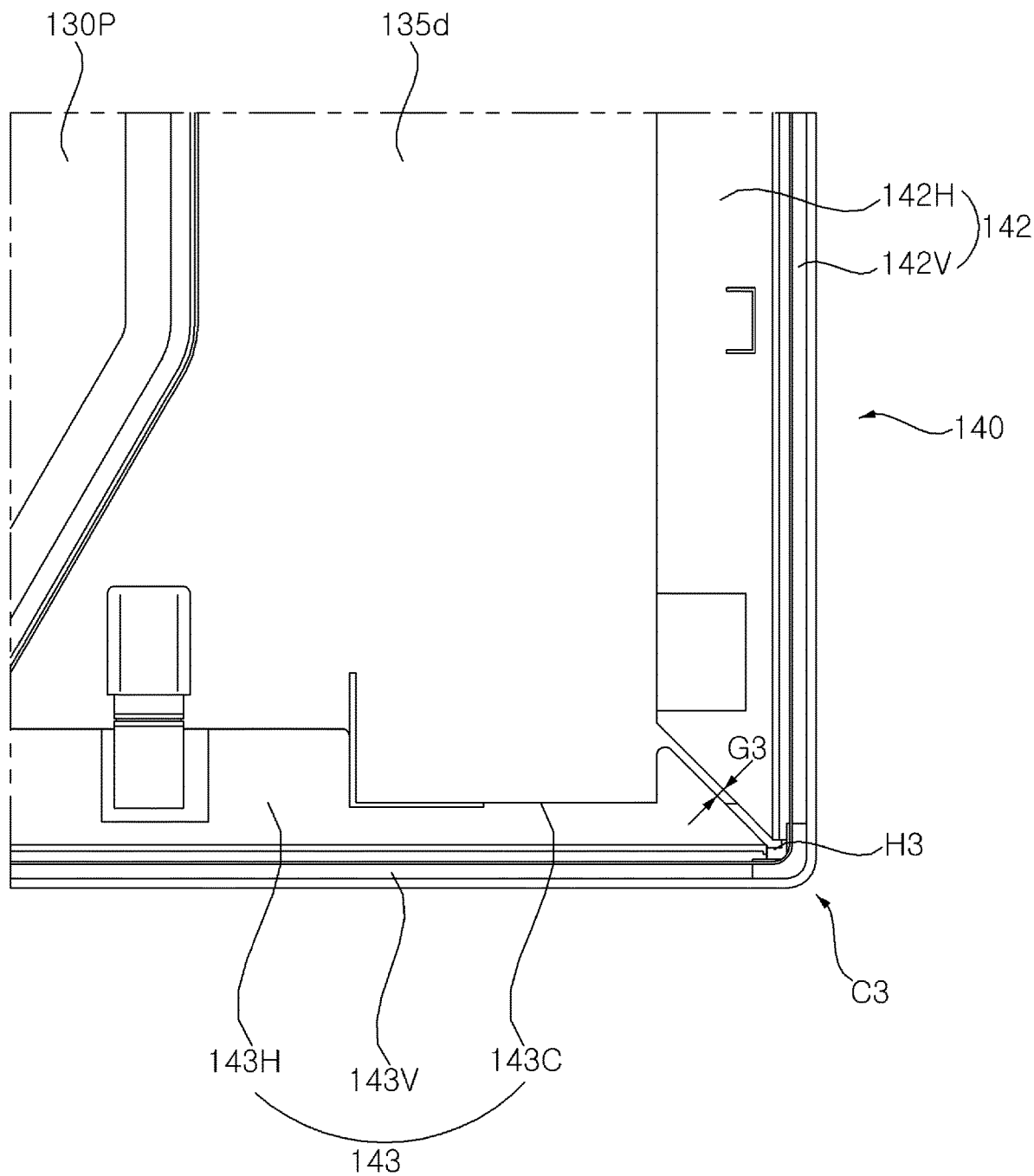

Referring to FIGS. 7 and 9, the side frame 140 may be coupled to the compression portion 135 (refer to FIG. 5) adjacent to the flat portion 130P. The side frame 140 may include a first part 141, a second part 142, a third part 143, a fourth part 144, and a fifth part 145. The second part 142 may be bent at a third corner C3 from the third part 143.

The third part 143 may include a horizontal portion 143H and a vertical portion 143V. The horizontal portion 143H of the third part 143 may be fixed on the third compression portion 135c (refer to FIG. 5). The second part 142 may include a horizontal portion 142H and a vertical portion 142V. The horizontal portion 142H of the second part 142 may be fixed on the fourth compression portion 135d (refer to FIG. 5).

A gap G3 may be formed between the horizontal portion 143H of the third part 143 and the horizontal portion 142H of the second part 142. The vertical portion 143V of the third part 143 and the vertical portion 142V of the second part 142 may be connected while being bent. A hole H3 may be formed between the vertical portions 143V and 142V and the horizontal portions 143H and 142H. The size of the hole H3 or the diameter of the hole H3 may be greater than the width of the gap G3. The description of the first corner C3 of the side frame 140 may be identically applied to the fourth corner C4 of the side frame 140.

Figure 8:
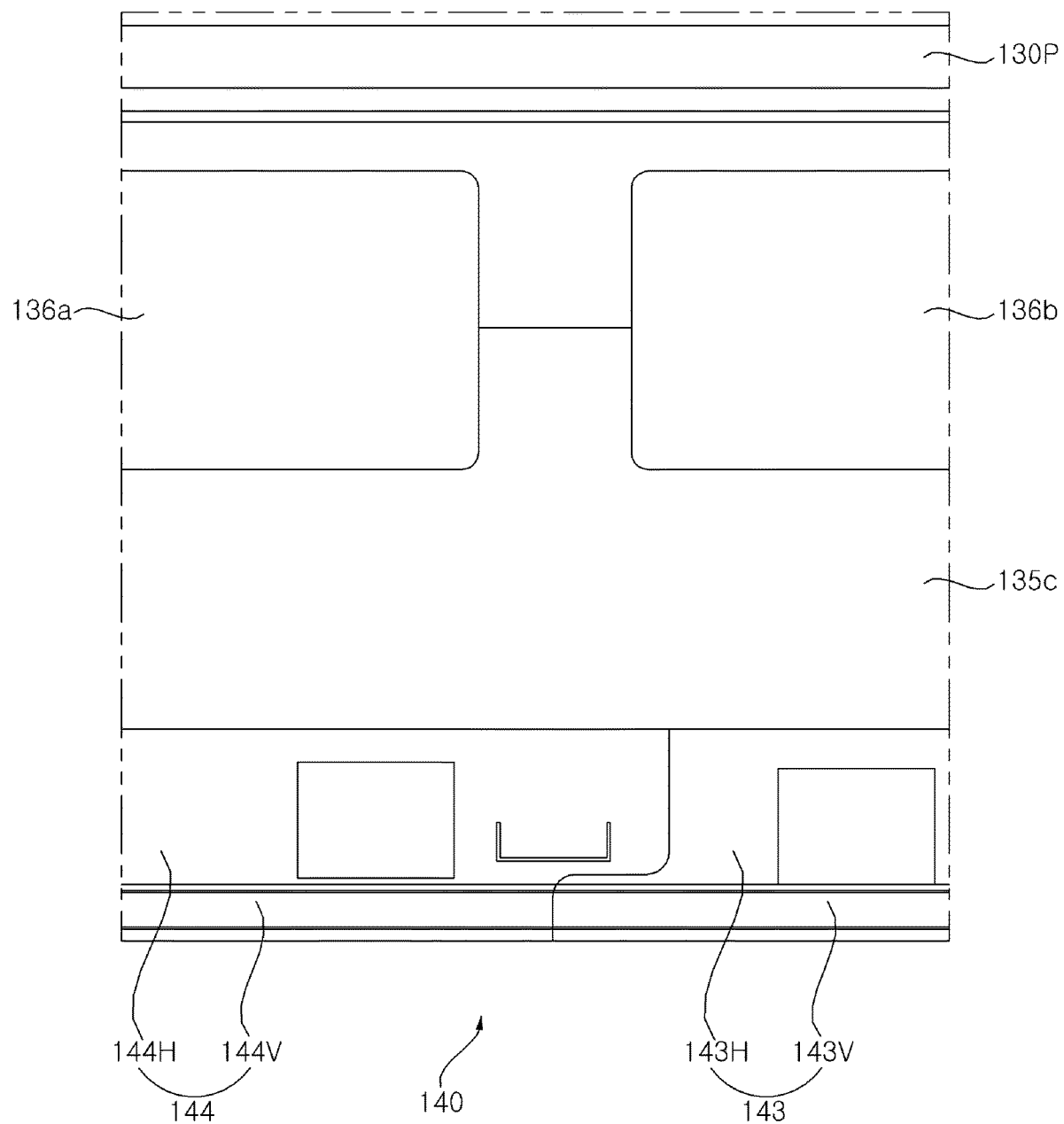

Referring to FIGS. 8 and 9, the third part 143 and the fourth part 144 of the side frame 140 may be located on or fixed to the third compression portion 135c. A distal end of the third part 143 of the side frame 140 may be coupled to a distal end of the fourth part 144 of the side frame 140.

The horizontal portion 144H of the fourth part 144 may contact the horizontal portion 143H and the vertical portion 143V of the third part 143. The vertical portion 144V of the fourth part 144 may contact the vertical portion 143V of the third part 143. The vertical portion 143V of the third part 143 may contact the horizontal portion 144H and the vertical portion 144V of the fourth part 144. The distal end of the third part 143 may be fixed to the distal end of the fourth part 144. For example, the distal end of the third part 143 and the distal end of the fourth part 144 may be fixed by welding.

Referring to FIG. 9, a heat dissipation plate HA may extend long to be fixed to the flat portion 130P. There may be a plurality of heat dissipation plates HA. For example, the heat dissipation plate HA may be a plate including aluminum. As another example, the heat dissipation plate HA may be a tape including aluminum. There may be a plurality of heat dissipation plates HA.

A first heat dissipation plate HA1 may extend in the left-right direction of the flat portion 130P, and may be located adjacent to the first part 141 of the side frame 140. A second heat dissipation plate HA2 may extend long in the left-right direction of the flat portion 130P, and may be adjacent to the first part 141 of the side frame 140, but may be adjacent to the first heat dissipation plate HA1. The first heat dissipation plate HA1 and the second heat dissipation plate HA2 may be sequentially disposed along the length direction of the first part 141 of the side frame 140.

A third heat dissipation plate HA3 may extend long in the left-right direction, and may be located adjacent to the first heat dissipation plate HA1 at the lower side of the first heat dissipation plate HA1. A fourth heat dissipation plate HA4 may extend long in the left-right direction, and may be located adjacent to the second heat dissipation plate HA2 at the lower side of the second heat dissipation plate HA2.

A fifth heat dissipation plate HA5 may extend long in the left-right direction, and may be located adjacent to the third heat dissipation plate HA3 at the lower side of the third heat dissipation plate HA3. A sixth heat dissipation plate HA6 may extend long in the left-right direction, and may be located adjacent to the fourth heat dissipation plate HA4 at the lower side of the fourth heat dissipation plate HA4.

A seventh heat dissipation plate HA7 may extend long in the left-right direction, and may be located adjacent to the fifth heat dissipation plate HA5 at the lower side of the fifth heat dissipation plate HA5. An eighth heat dissipation plate HA8 may extend long in the left-right direction, and may be located adjacent to the sixth heat dissipation plate HA6 at the lower side of the sixth heat dissipation plate HA6.

A ninth heat dissipation plate HA9 may extend long in the left-right direction, and may be located adjacent to the seventh heat dissipation plate HA7 at the lower side of the seventh heat dissipation plate HA7. A tenth heat dissipation plate HA10 may extend long in the left-right direction, and may be located adjacent to the eighth heat dissipation plate HA8 at the lower side of the eighth heat dissipation plate HA8.

A eleventh heat dissipation plate HA11 may extend long in the left-right direction, and may be located adjacent to the ninth heat dissipation plate HA9 at the lower side of the ninth heat dissipation plate HA9. A twelfth heat dissipation plate HA12 may extend long in the left-right direction, and may be located adjacent to the tenth heat dissipation plate HA10 at the lower side of the tenth heat dissipation plate HA10.

Figure 10:
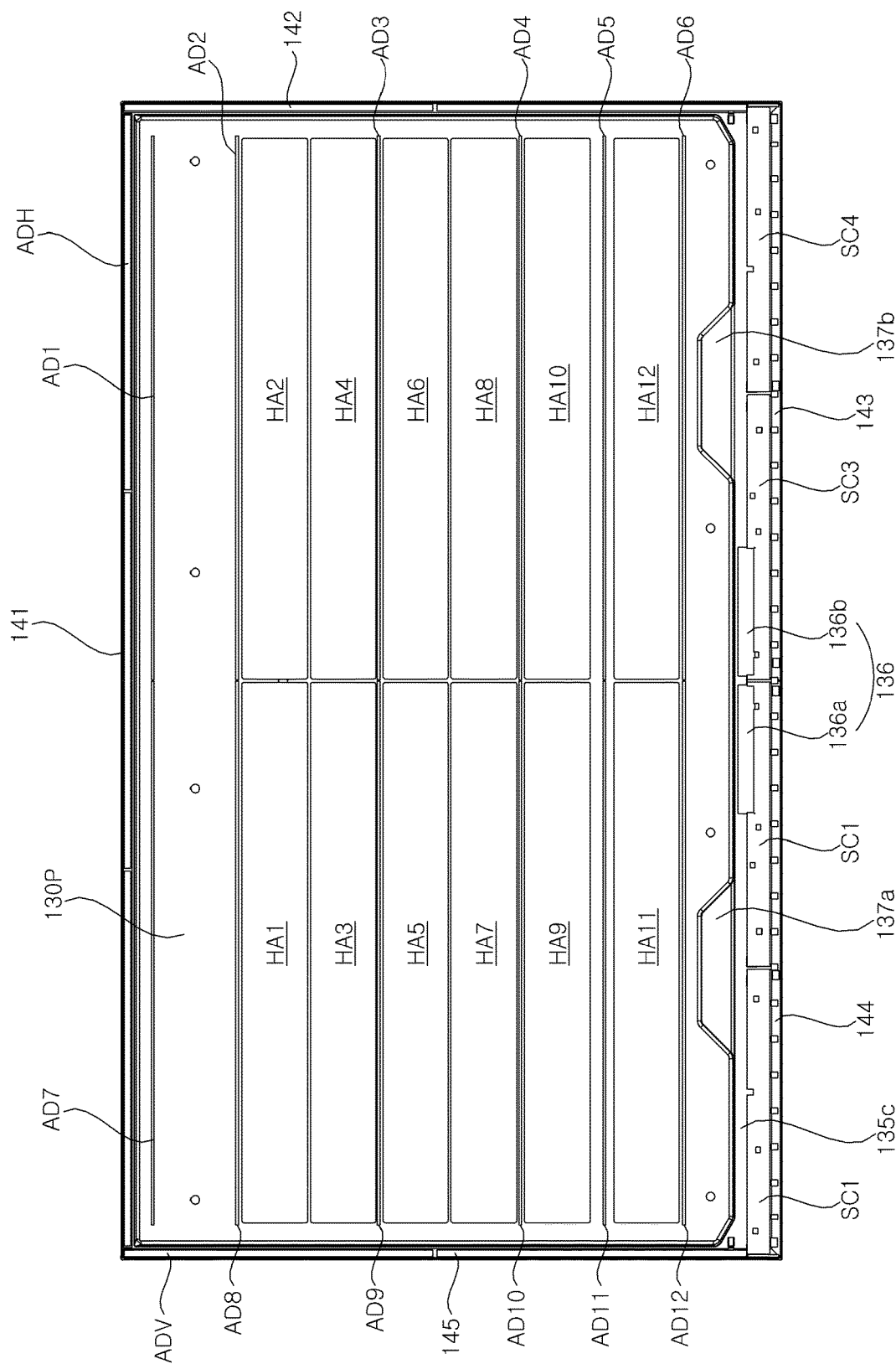

Referring to FIG. 10, a side adhesive member ADH, ADV may be fixed on the side frame 140. There may be a plurality of side adhesive members ADH and ADV. Each of the plurality of side adhesive members ADH and ADV may be fixed to each of a first part 141, a second part 142, a third part 143, a fourth part 144, and a fifth part 145 of the side frame 140.

The panel adhesive member AD may be fixed on the flat portion 130P. There may be a plurality of panel adhesive members AD. A first panel adhesive member AD1 may extend long in the left-right direction adjacent to the first part 141 of the side frame 140, and be fixed on the flat portion 130P. A seventh panel adhesive member AD7 may extend long in the left-right direction adjacent to the first part 141 of the side frame 140, and be fixed on the flat portion 130P. The seventh panel adhesive member AD7 may be disposed in one line with the first panel adhesive member AD1.

A second panel adhesive member AD2 may extend long in the left-right direction adjacent to an upper side of the second heat dissipation plate HA2, and be fixed on the flat portion 130P. A third panel adhesive member AD3 may extend long in the left-right direction to be fixed on the flat portion 130P between the fourth heat dissipation plate HA4 and the sixth heat dissipation plate HA6. A fourth panel adhesive member AD4 may extend long in the left-right direction to be fixed on the flat portion 130P between the eighth heat dissipation plate HA8 and the tenth heat dissipation plate HA10.

A fifth panel adhesive member AD5 may extend long in the left-right direction to be fixed on the flat portion 130P between the tenth heat dissipation plate HA10 and the twelfth heat dissipation plate HA12. A sixth panel adhesive member AD6 may extend long in the left-right direction adjacent to a lower side of the twelfth heat dissipation plate HA12, and be fixed on the flat portion 130P.

An eighth panel adhesive member AD8 may extend long in the left-right direction adjacent to the upper side of the first heat dissipation plate HA1 to be fixed on the flat portion 130P. A ninth panel adhesive member AD9 may extend long in the left-right direction to be fixed on the flat portion 130P between the third heat dissipation plate HA3 and the fifth heat dissipation plate HA5. A tenth panel adhesive member AD10 may extend long in the left-right direction to be fixed on the flat portion 130P between the seventh heat dissipation plate HA7 and the ninth heat dissipation plate HA9.

An eleventh panel adhesive member AD11 may extend long in the left-right direction to be fixed on the flat portion 130P between the ninth heat dissipation plate HA9 and the eleventh heat dissipation plate HA11. A twelfth panel adhesive member AD12 may extend long in the left-right direction adjacent to the lower side of the eleventh heat dissipation plate HA11, and be fixed on the flat portion 130P.

Figure 11:
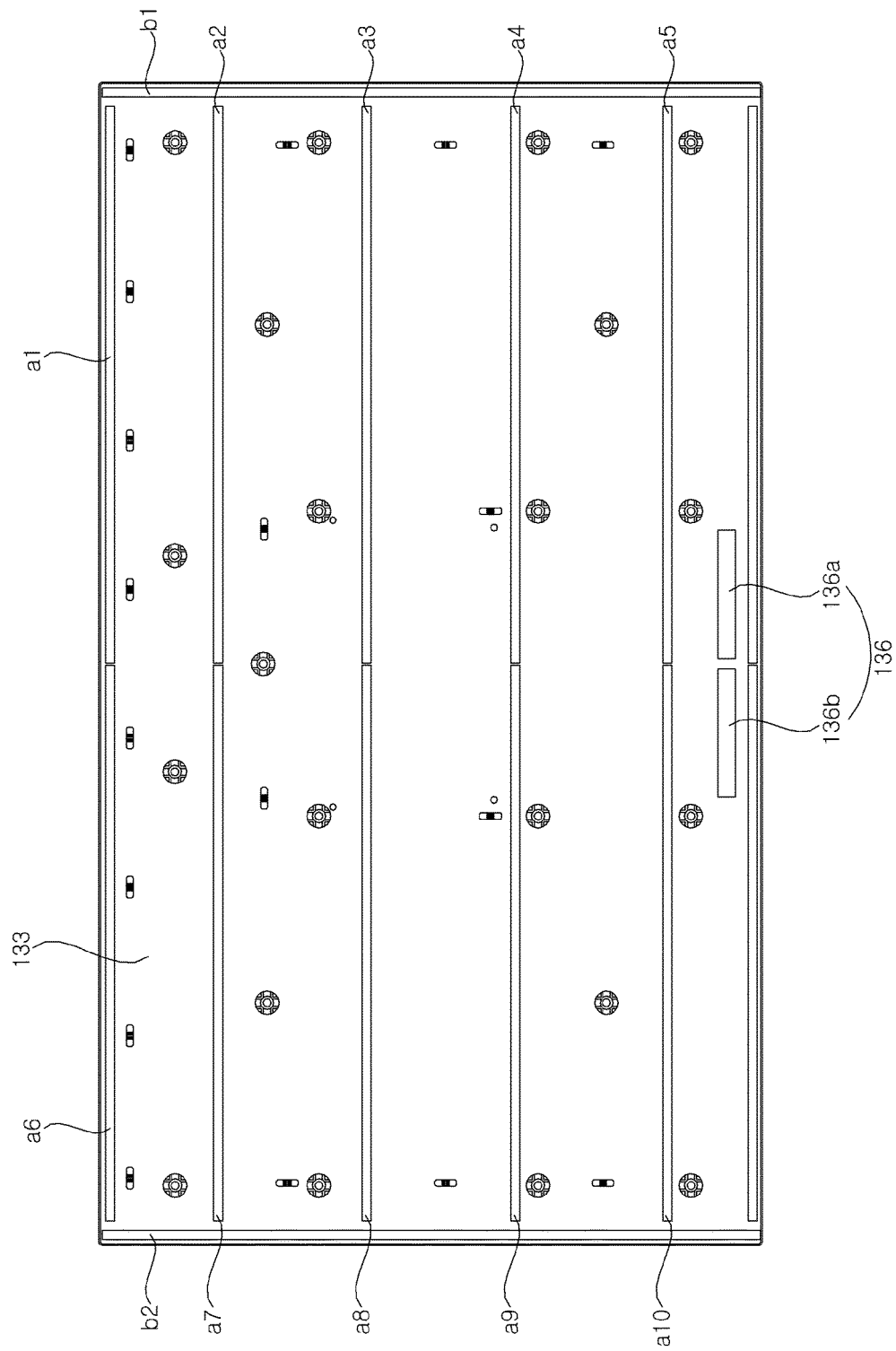
Figure 12:
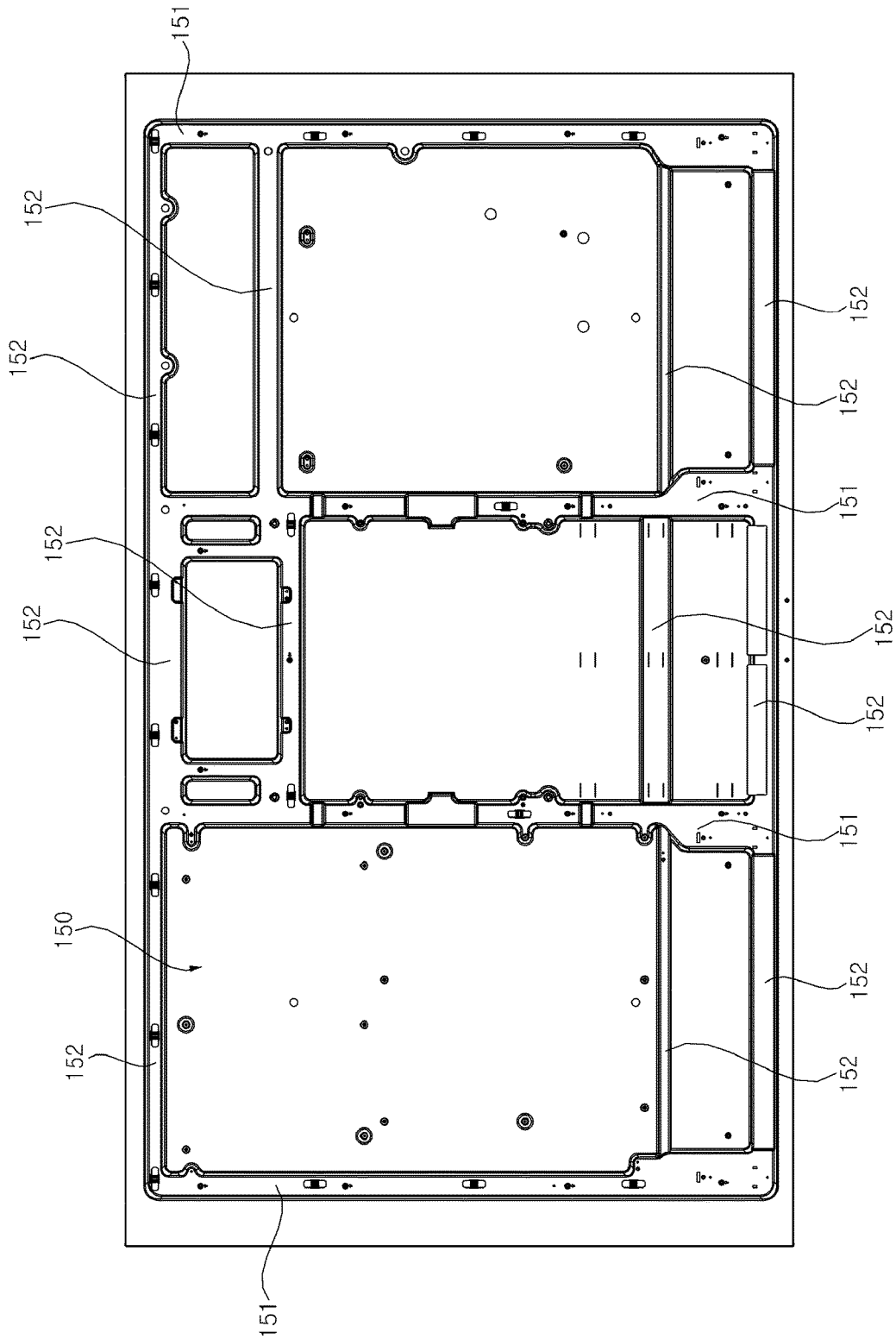
Figure 13:
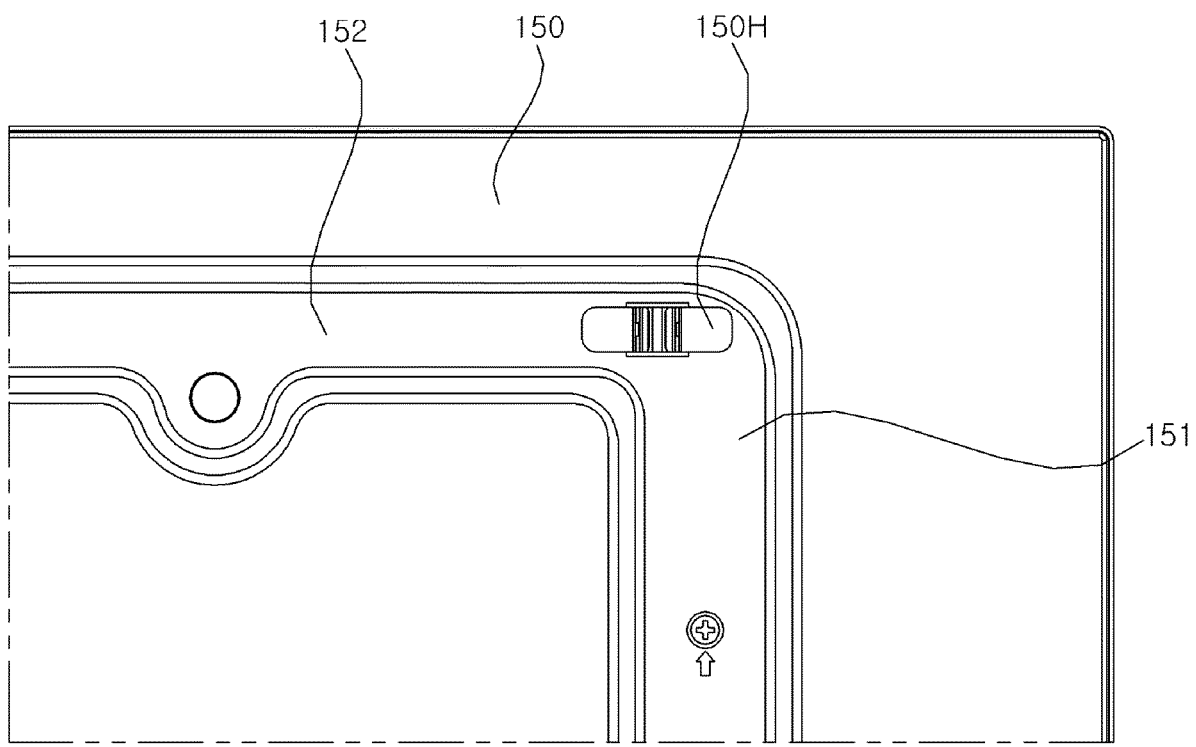

Referring to FIGS. 11 to 13, a rear adhesive member a, b may be fixed to the rear surface of the corrugate panel 130. There may be a plurality of rear adhesive members a and b, and the plurality of rear adhesive members a and b may be fixed to the rear skin 133 while extending in the left-right direction or in the up-down direction.

The module cover 150 may be coupled to the rear skin 133 of the corrugate panel 130 by rear adhesive members a and b. The module cover 150 may be bent while being pressed. The module cover 150 may include a horizontal rigid portion 152 that protrudes long in the left-right direction while being pressed, and a vertical rigid portion 151 that protrudes long in the up-down direction. Accordingly, the bending rigidity and/or torsional rigidity of the module cover 150 may be improved.

A holder 150H may be coupled to the module cover 150. The holder 150H may be fixed on the vertical rigid portion 151 and/or the horizontal rigid portion 152 of the module cover 150.

Figure 14:
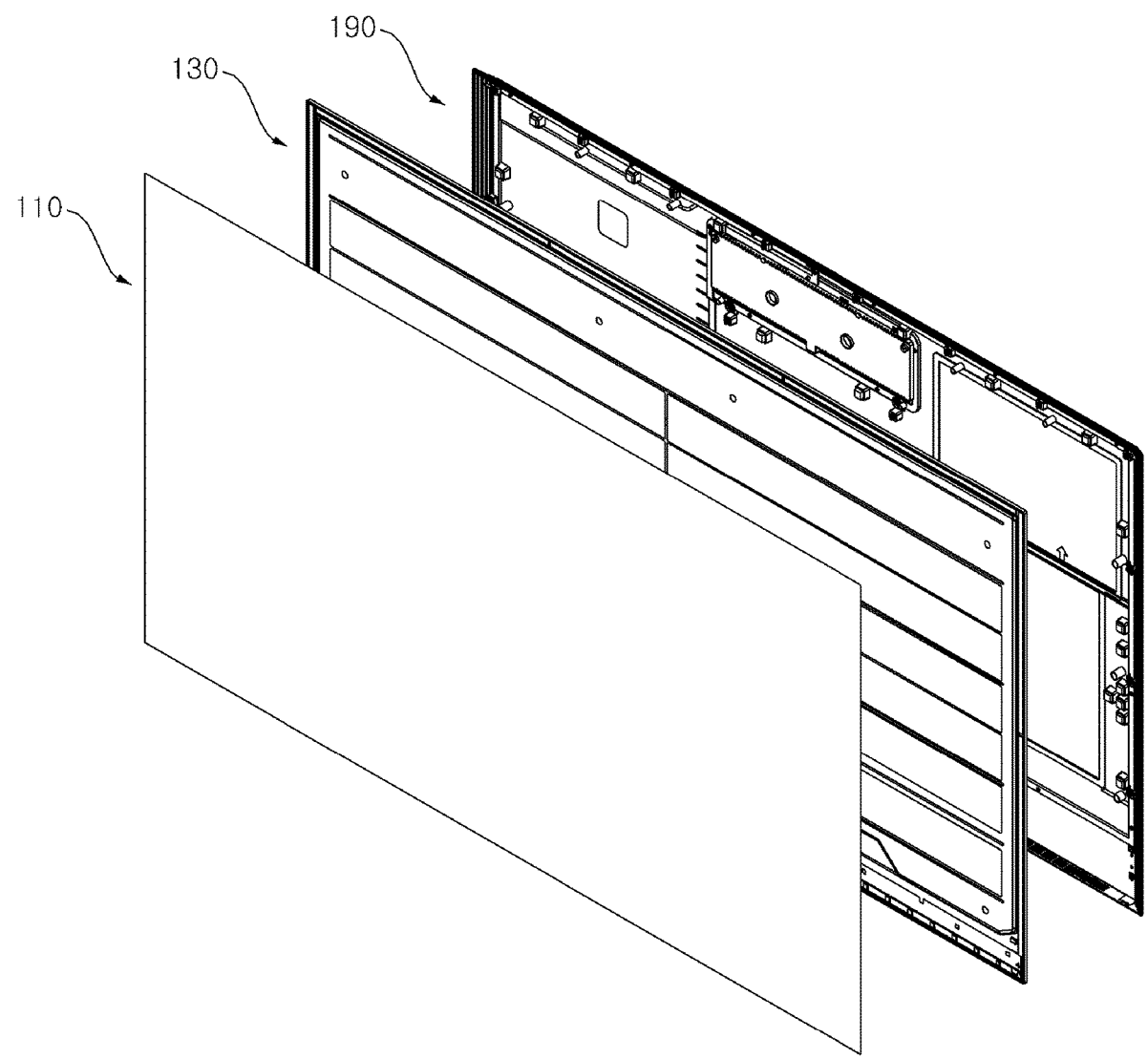

Referring to FIGS. 13 and 14, the display panel 110 may be located on the front surface of the corrugate panel 130, and the display panel 110 may be coupled to the corrugate panel 130. A back cover 190 may be coupled to the module cover 150 (refer to FIG. 12) in the rearward direction of the corrugate panel 130. The back cover 190 may be coupled to the holder 150H (refer to FIG. 13). The display panel 110 may be fixed to the front surface of the side frame 140 and/or the corrugate panel 130 by the side adhesive member ADH, ADV and the panel adhesive member AD described above.

Figure 15:
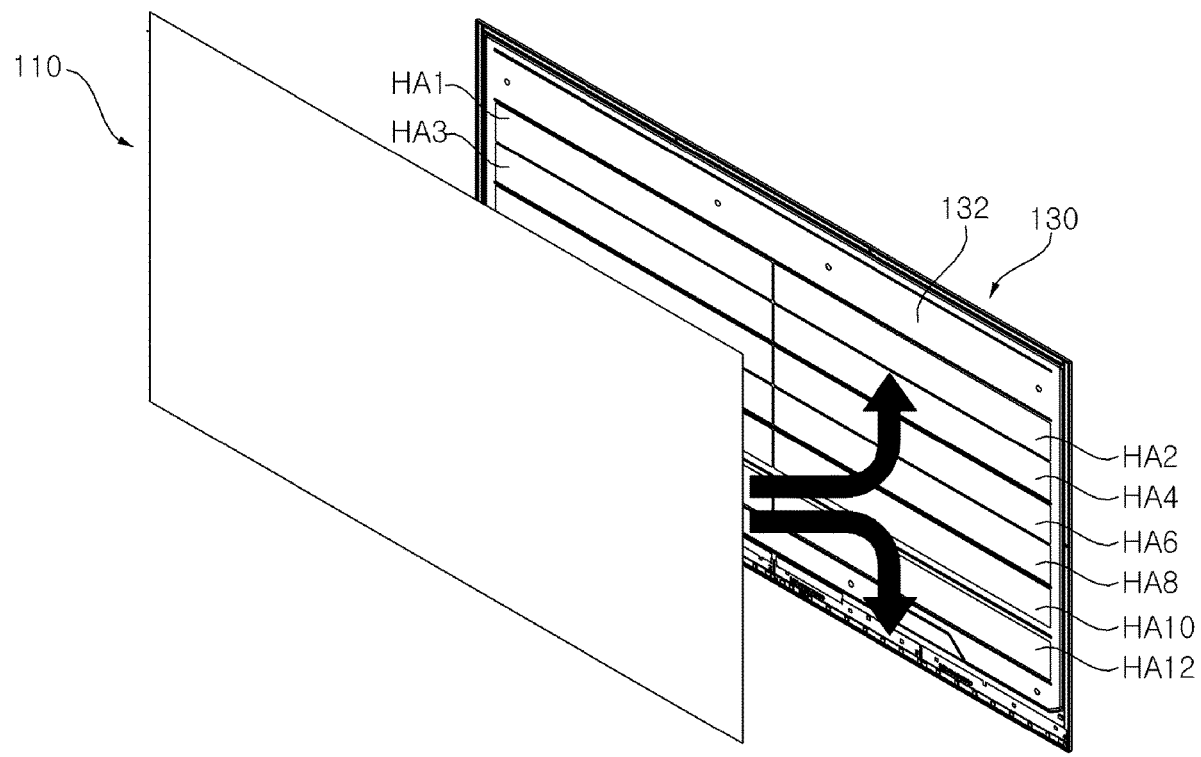
Figure 16:
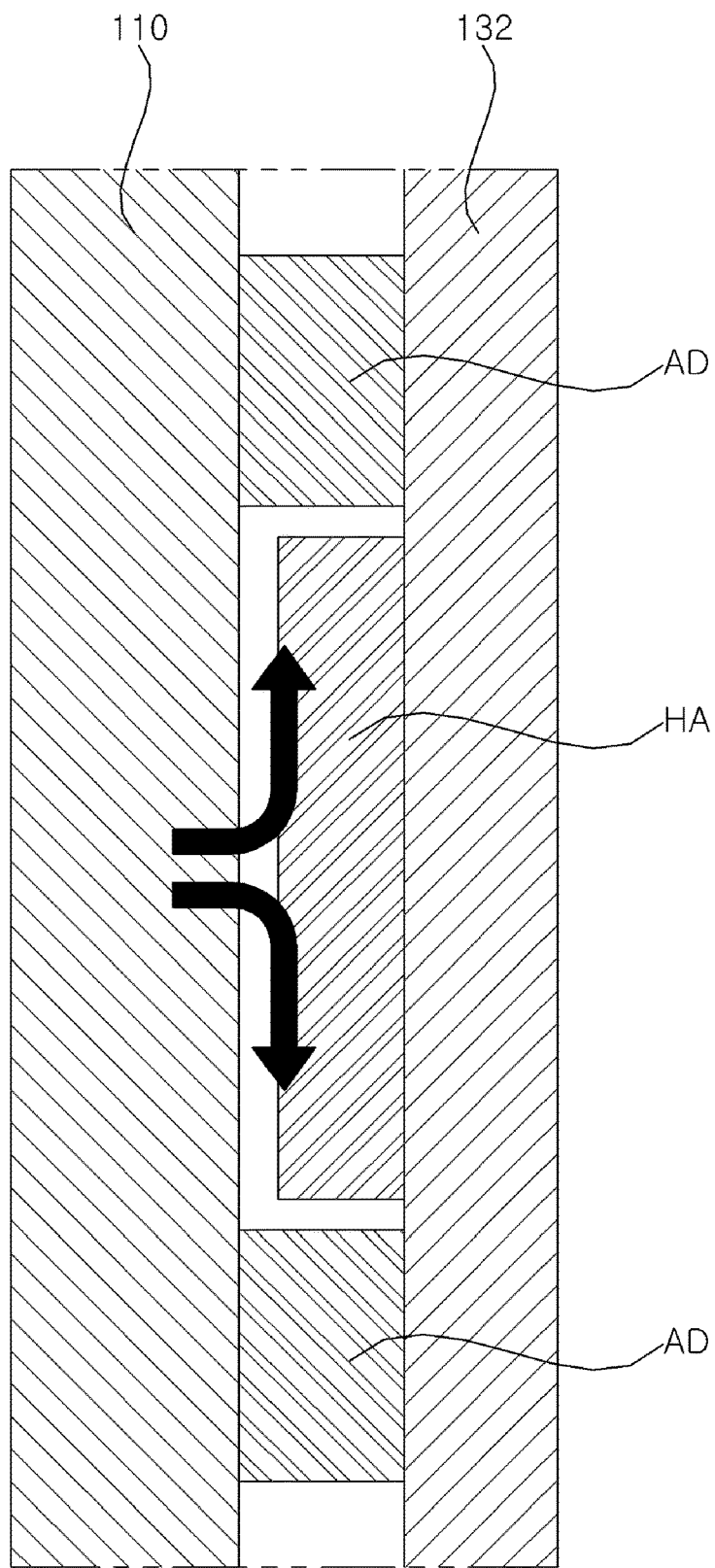

Referring to FIGS. 15 and 16, the display panel 110 may be coupled or fixed to the front skin 132 of the corrugate panel 130 by the adhesive member AD.

The heat dissipation plate HA may be located in an air-gap formed between the corrugate panel 130 and the display panel 110. The rear surface of the heat dissipation plate HA may be fixed to the front skin 132, and the front surface of the heat dissipation plate HA may be spaced apart from the rear surface of the display panel 110.

For example, the thickness of the adhesive member AD may be 0.2 to 0.4 mm. For example, the thickness of the heat dissipation plate HA may be 0.15 to 0.25 mm. For example, the gap formed between the display panel 110 and the heat dissipation plate HA may be 0.04 to 0.1 mm.

Since the distance of the air-gap is reduced by the heat dissipation plate HA, heat generated from the display panel 110 may be more effectively dissipated.

Figure 17:
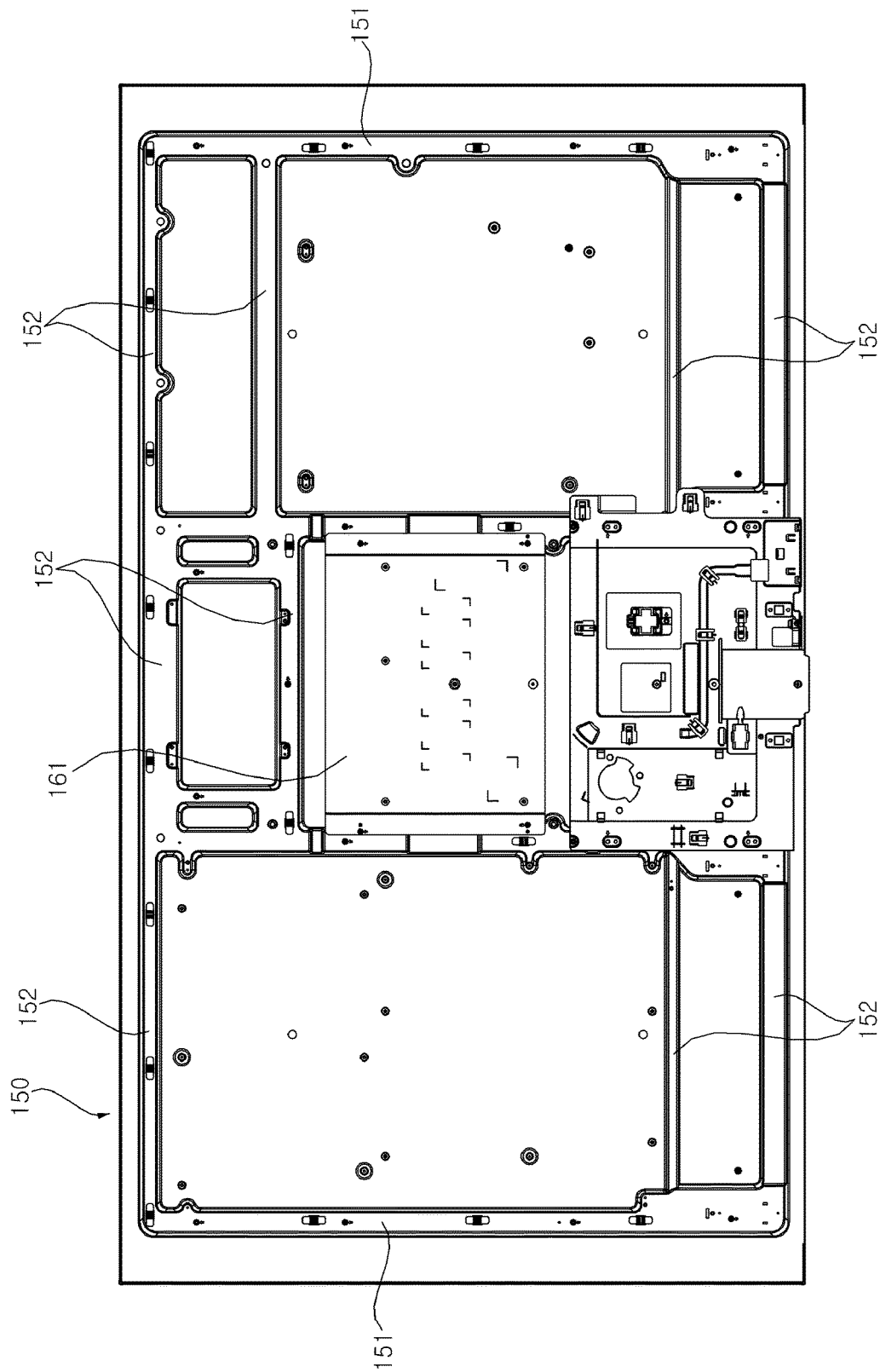
Figure 18:
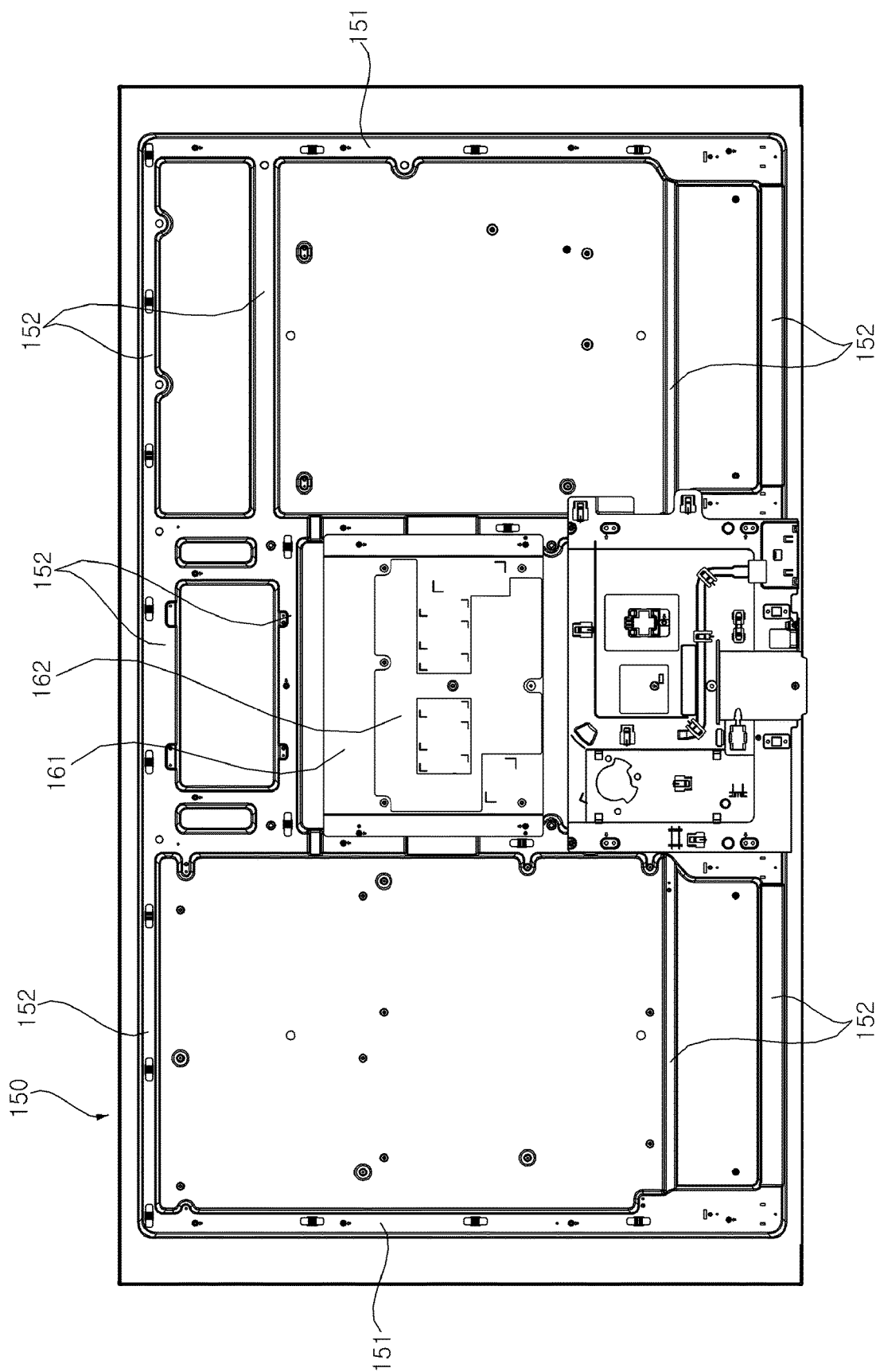

Referring to FIGS. 17 and 18, a first plate 161 may be coupled to the rear surface of the module cover 150. The first plate 161 may be fixed to the vertical rigid portion 151 and/or the horizontal rigid portion 152 protruding from the rear surface of the module cover 150. For example, the first plate 161 may include aluminum and may have a thickness of 1.5 to 2.5 mm.

A T-CON board T (refer to FIG. 22) may be mounted or fixed on the first plate 161. In addition, a shield plate 162 may be mounted or fixed on the first plate 161 while covering the T-CON board T. For example, the thickness of the shield plate 162 may be 1.5 to 2.0 mm. The shield plate 162 may include metal. The shield plate 162 may cover at least a portion of the T-CON board T.

Figure 19:
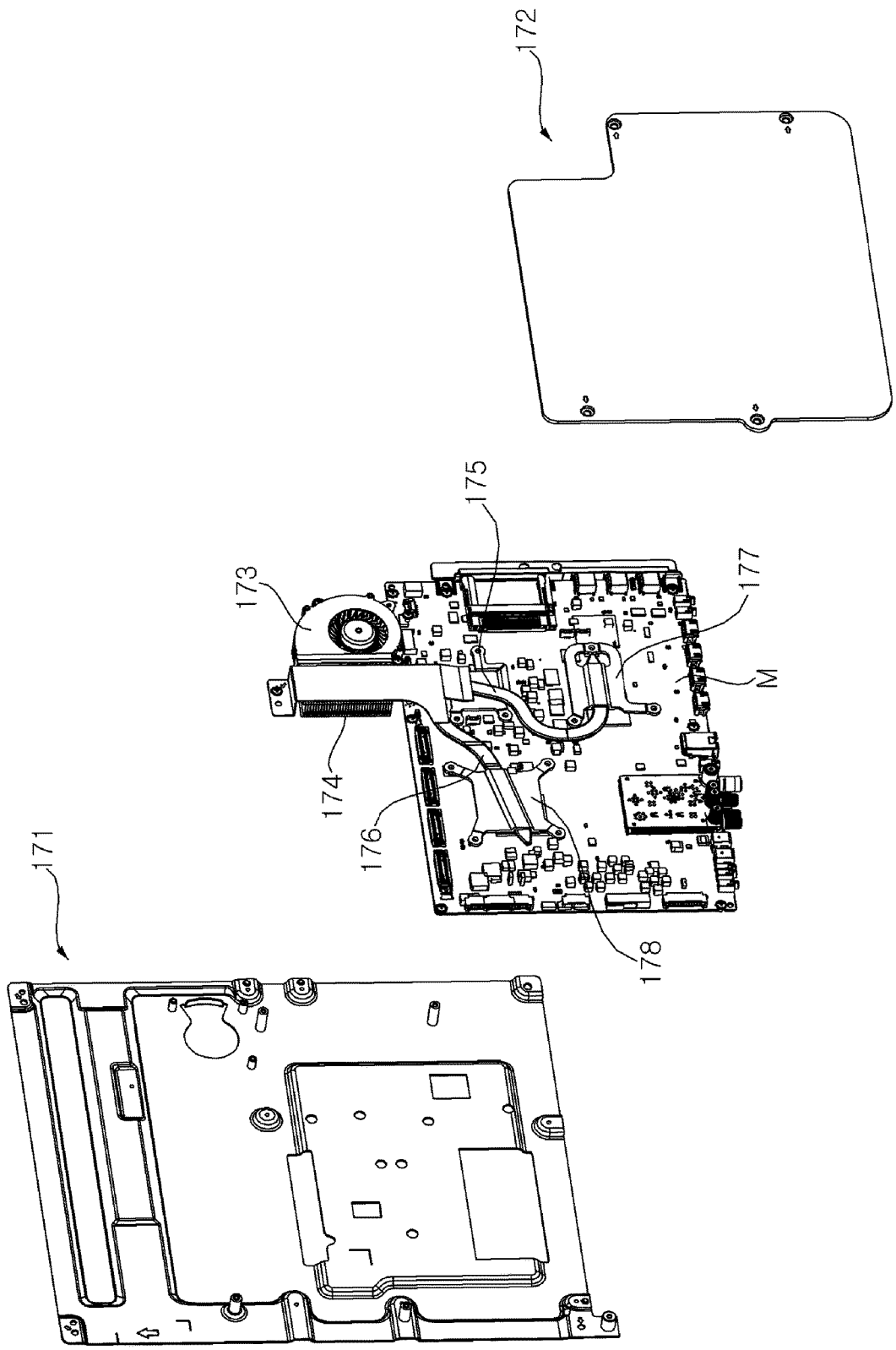
Figure 20:
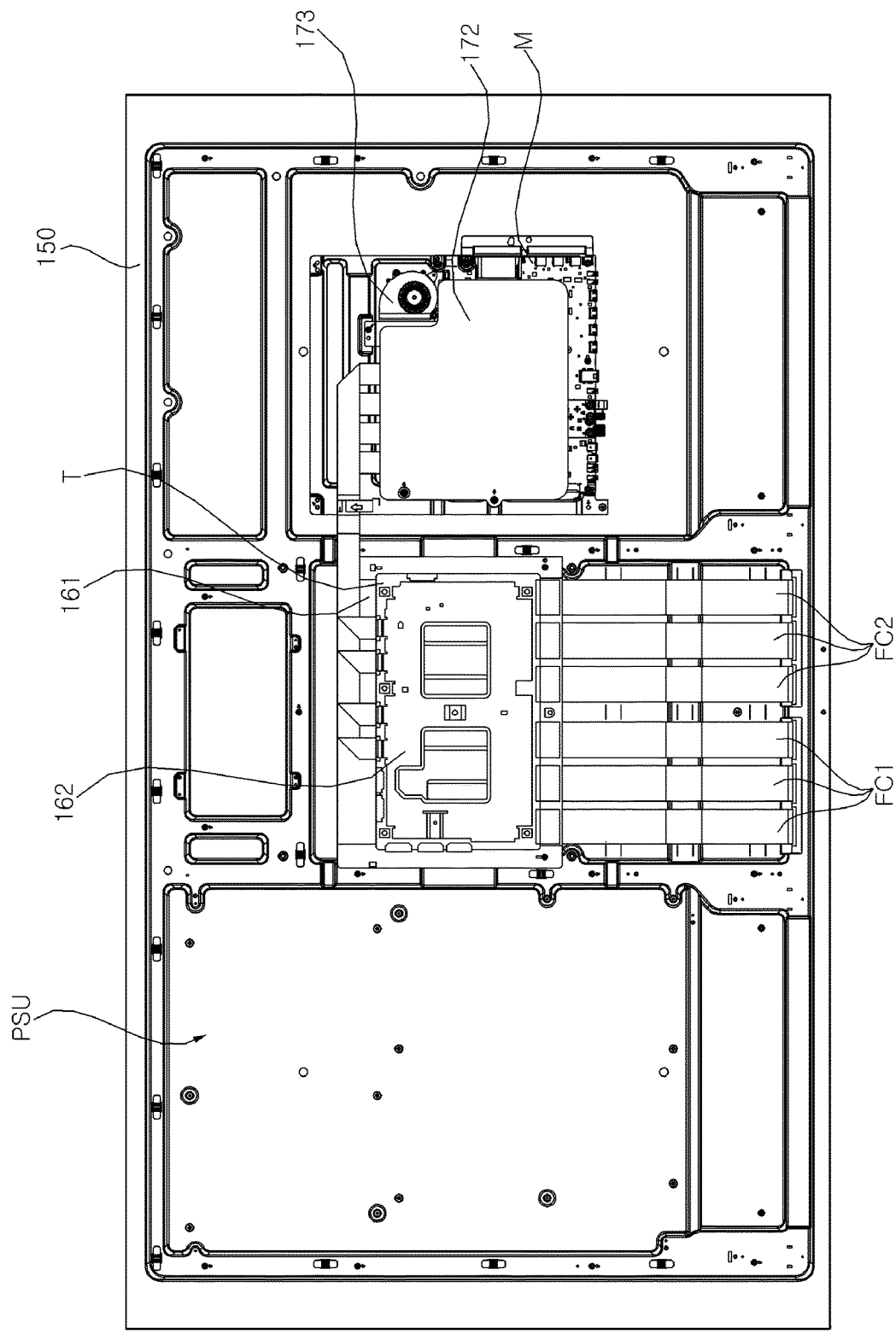

Referring to FIGS. 19 and 20, a power supply (PSU) may be installed on the right rear surface of the module cover 150. The power supply PSU may be referred to as a power supply unit PSU. FFC cables FC1 and FC2 connected from the display panel 110 (refer to FIG. 14) through the cable hole 136 (refer to FIG. 5) of the corrugate panel 130 (refer to FIG. 5) may be connected to the T-CON board T. Accordingly, the T-CON board T may provide an image signal to the display panel 110.

Electronic devices may be mounted on a main board M. For example, the electronic devices may be IC chips. A heat dissipation fin 174 may be located adjacent to the main board M. The heat dissipation fin 174 may be located in the upper side of the main board M. A fan 173 may be located adjacent to the heat dissipation fin 174 and may generate an airflow passing through the heat dissipation fin 174. The fan 173 may be located in the upper side of the main board M.

One side of a heat pipe 175, 176 may contact the main board M and electronic devices mounted on the main board M, and the other side may contact the heat dissipation fin 174. There may be a plurality of heat pipes 175 and 176. The heat pipe 175, 176 may be disposed on the main board M while being bent several times. The heat pipe 175, 176 may be in contact with the electronic device by a bracket 177, 178.

The main board M may be mounted or fixed on a third plate 171. For example, the third plate 171 may include aluminum. A fourth plate 172 may cover the main board M and may be coupled to the third plate 171 and/or the main board M. For example, the fourth plate 172 may include aluminum. The third plate 171 may face the fourth plate 172 with respect to the main board M, and the main board M may be located between the third plate 171 and the fourth plate 172.

Accordingly, it is possible to more effectively dissipate the high heat generated by the main board M.

Figure 21:
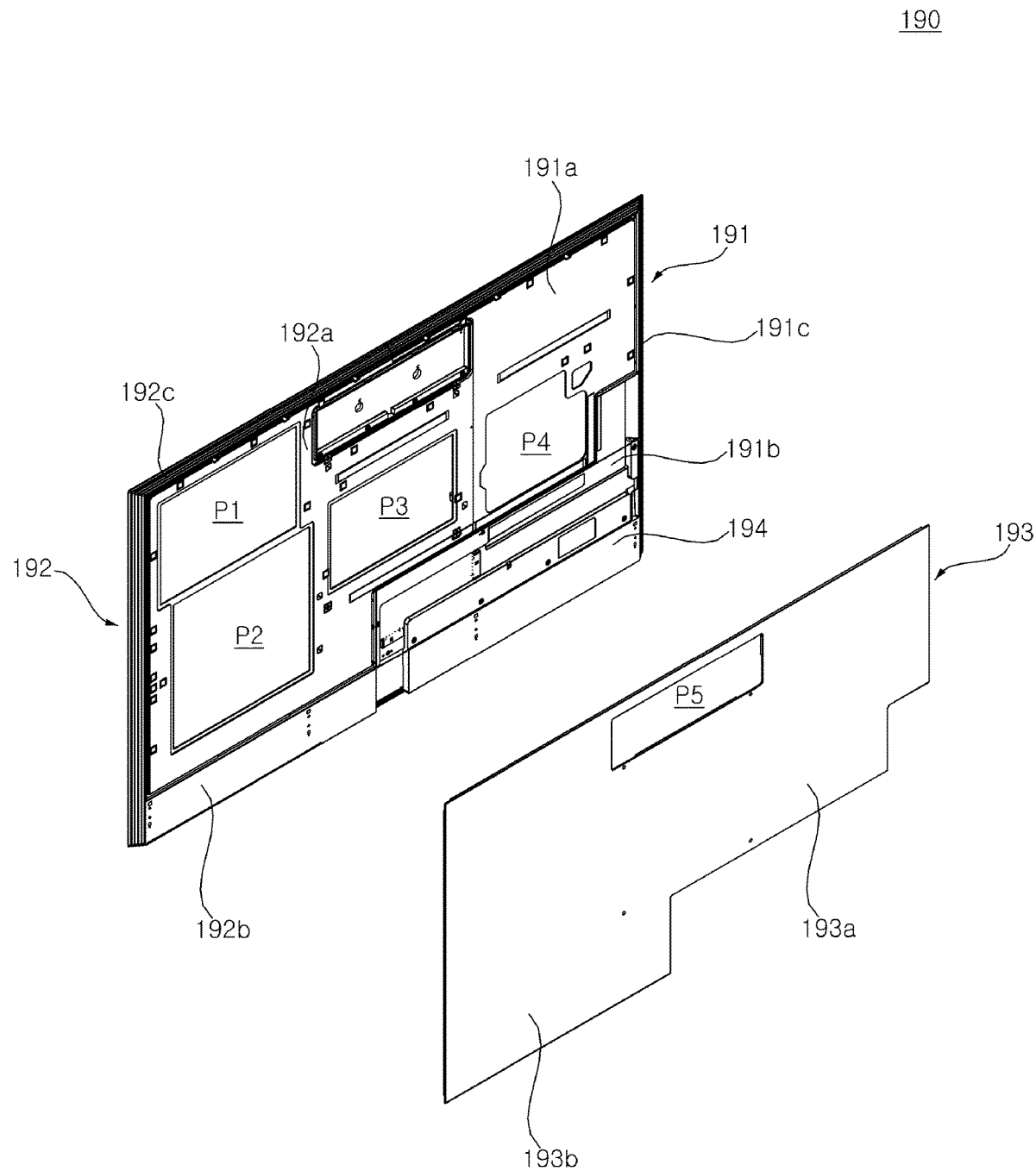

Referring to FIG. 21, the back cover 190 may include a plurality of pieces. The back cover 190 may include a first piece 191, a second piece 192, a third piece 193, and a fourth piece 194. The first piece 191 may be coupled to the second piece 192. The third piece 193 may be coupled to the first piece 191 and the second piece 192. The fourth piece 194 may be coupled to the first piece 191. For example, the first piece 191 and the second piece 192 may be synthetic resin, and the third piece 193 and the fourth piece 194 may be metal.

The first piece 191 may include a first part 191a, a second part 191b, and a third part 191c. The first part 191a may have an overall square shape. The second part 191b may have an overall rectangular shape. The second part 191b may be connected to the lower side of the first part 191a. The width of the second part 191b in the left-right direction may be greater than the width of the first part 191a. The third part 191c may be a sidewall connected to the upper and left sides of the first part 191a and the left and/or lower sides of the second part 191b. The third part 191c may be formed to be longer than the length of the upper side of the first part 191a at the upper side of the first part 191a, and protrude toward one side of the first part 191a. A fourth opening P4 may be formed in the first part 191a. The fourth plate 172 (refer to FIG. 19) on the main board M may be exposed to the outside through the fourth opening P4.

The second piece 192 may include a first part 192a, a second part 192b, and a third part 192c. The first part 192a may have an overall rectangular shape. The second part 192b may have an overall rectangular shape. The second part 192b may be connected to the lower side of the first part 192a. The width of the first part 192a in the left-right direction may be greater than the width of the second part 192b. The third part 192c may be a sidewall connected to the upper and right sides of the first part 192a and the right and lower sides of the second part 192b. The third part 192c may be formed to be shorter than the length of the upper side of the first part 192a at the upper side of the first part 192a, so that the third part 191c protruding from the upper side of the first piece 191 may be inserted or located. A first opening P1 and a third opening P3 may be formed in the first part 192a. The upper portion of the power supply PSU (refer to FIG. 20) may be exposed to the outside through the first opening P1, and the T-CON board T (refer to FIG. 20) or the shield plate 162 (refer to FIG. 20) may be exposed to the outside through a third opening P3. A second opening P2 may be formed in the first part 192a and/or the second part 192b. A lower portion of the power supply PSU may be exposed to the outside through the second opening P2.

The third piece 193 may cover the rear surface of the second piece 192 and the rear surface of the first part 191a of the first piece 191. A fifth opening P5 may be formed in the upper side of the third piece 193. The third piece 193 may cover the first opening P1, the second opening P2, the third opening P3, and/or the fourth opening P4. For example, the third piece P3 may include aluminum. Accordingly, heat generated from the power supply PSU, the T-CON board T, and the main board M can be effectively dissipated to the outside.

Figure 22:
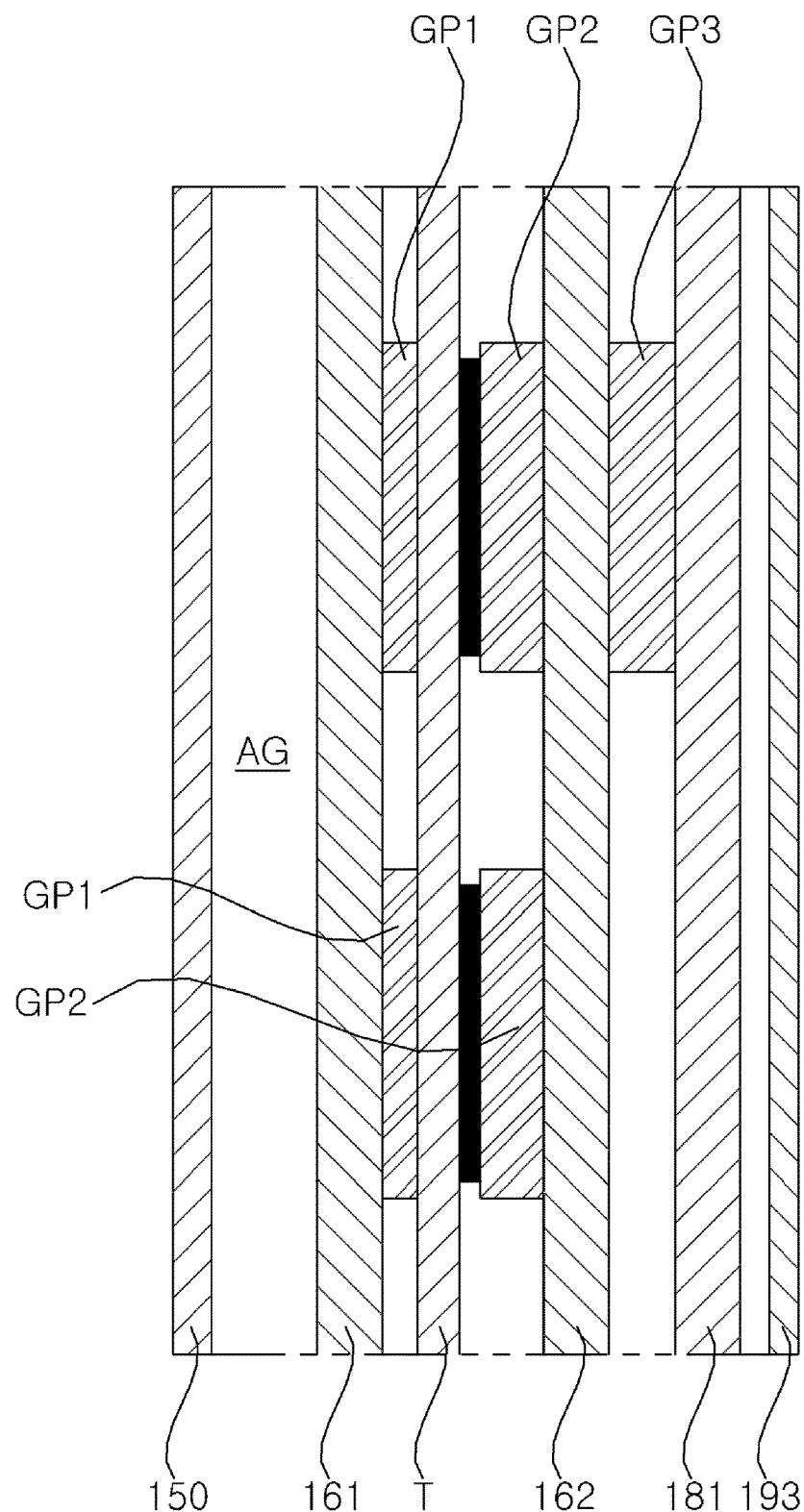

Referring to FIG. 22, the T-CON board T may be located on the first plate 161. A first gap pad GP1 may be located between the T-CON board T and the first plate 161. The first gap pad GP1 may contact the T-CON board T and/or the first plate 161. An insulating layer may be formed between the T-CON board T and the first gap pad GP1.

The shield plate 162 may cover the T-CON board T. A second gap pad GP2 may be located between the shield plate 162 and the T-CON board T. The second gap pad GP2 may contact the shield plate 162 and/or the T-CON board T. In this case, an insulating layer may be formed between the second gap pad GP2 and the T-CON board T.

A second plate 181 may be located between the third piece 193 of the back cover 190 and the shield plate 162. A third gap pad GP3 may be located between the shield plate 162 and the second plate 181. The third gap pad GP3 may contact the shield plate 162 and/or the second plate 181. The second plate 181 may be spaced apart from or in contact with the third piece 193 of the back cover 190.

A space AG may be formed between the module cover 150 and the first plate 161. For example, the space AG may be 7 to 8 mm.

Accordingly, the heat generated in the T-CON board T may be dissipated through the shield plate 162 through the second gap pad GP2. In addition, the heat generated in the T-CON board T may be dissipated through the second gap pad GP2, the shield plate 162, and/or the second plate 181. In addition, the heat generated in the T-CON board T may be dissipated through the second gap pad GP2, the shield plate 162, the second plate 181, and/or the third piece 193 of the back cover 190. In addition, the heat generated in the T-CON board T may be dissipated through the first gap pad GP1 and the first plate 161, and may be prevented from being transmitted to the front surface of the module cover 150 by the space AG.

Figure 23:
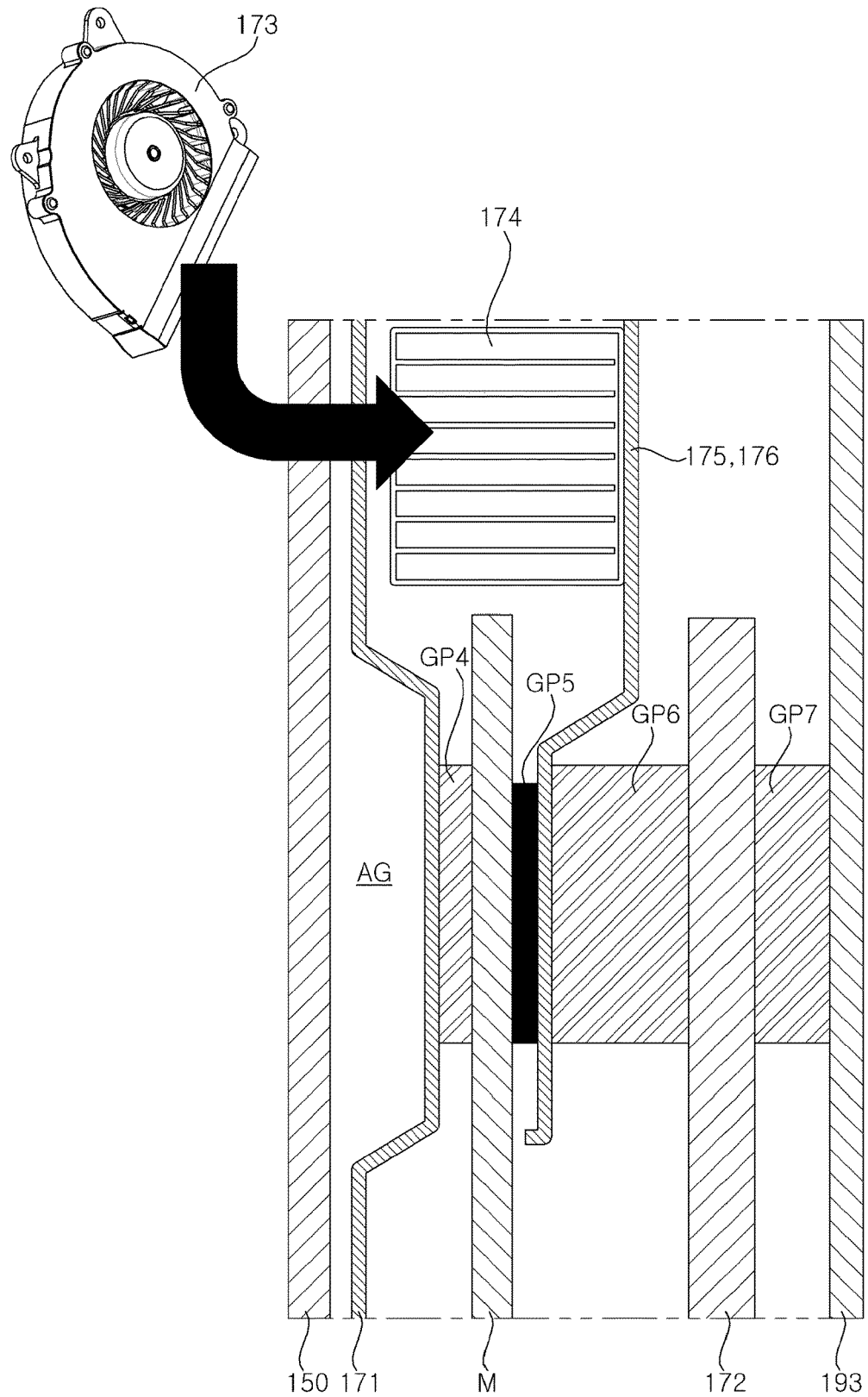

Referring to FIG. 23, the third plate 171 may form a module cover 150 and a space AG. For example, the distance AG between the third plate 171 and the module cover 150 may be 4 to 5 mm. The main board M may be mounted on the third plate 171. For example, the third plate 171 may be aluminum, and the thickness of the third plate 171 may be 1 to 1.5 mm. A fourth gap pad GP4 may be located between the main board M and the third plate 171. The fourth gap pad GP4 may contact the main board M and/or the third plate 171. An insulating layer may be formed between the fourth gap pad GP4 and the main board M.

A fifth gap pad GP5 may be located between the heat pipe 175, 176 and the main board M. The fifth gap pad GP5 may contact the heat pipe 175, 176 and/or the main board M. An insulating layer may be formed between the fifth gap pad GP5 and the main board M.

A sixth gap pad GP6 may be located between the heat pipe 175, 176 and the fourth plate 172. The sixth gap pad GP6 may contact the heat pipe 175, 176 and/or the fourth plate 172. For example, the fourth plate 172 may be aluminum, and the thickness of the fourth plate 172 may be 2 to 4 mm.

The third piece 193 of the back cover 190 may be located in the rearward direction of the fourth plate 172. A seventh gap pad GP7 may be located between the fourth plate 172 and the third piece 193 of the back cover 190. The seventh gap pad GP7 may contact the fourth plate 172 and/or the third piece 193 of the back cover 190.

Accordingly, the heat generated in the main board M may be transmitted to the heat dissipation fin 174 through the heat pipe 175, 176, and the heat dissipation fin 174 may be air cooled by the fan 173. In addition, the heat generated in the main board M may be dissipated through the fifth gap pad GP5, the heat pipe 175, 176, the sixth gap pad GP6, and/or the fourth plate 172. In addition, the heat generated in the main board M may be dissipated through the fifth gap pad GP5, the heat pipe 175, 176, the sixth gap pad GP6, the fourth plate 172, the seventh gap pad GP7, and/or the third piece 193 of the back cover 190. In addition, the heat generated in the main board M may be dissipated through the third plate 171, and may be prevented from being transmitted to the module cover 150 by the space AG.

Figure 24:
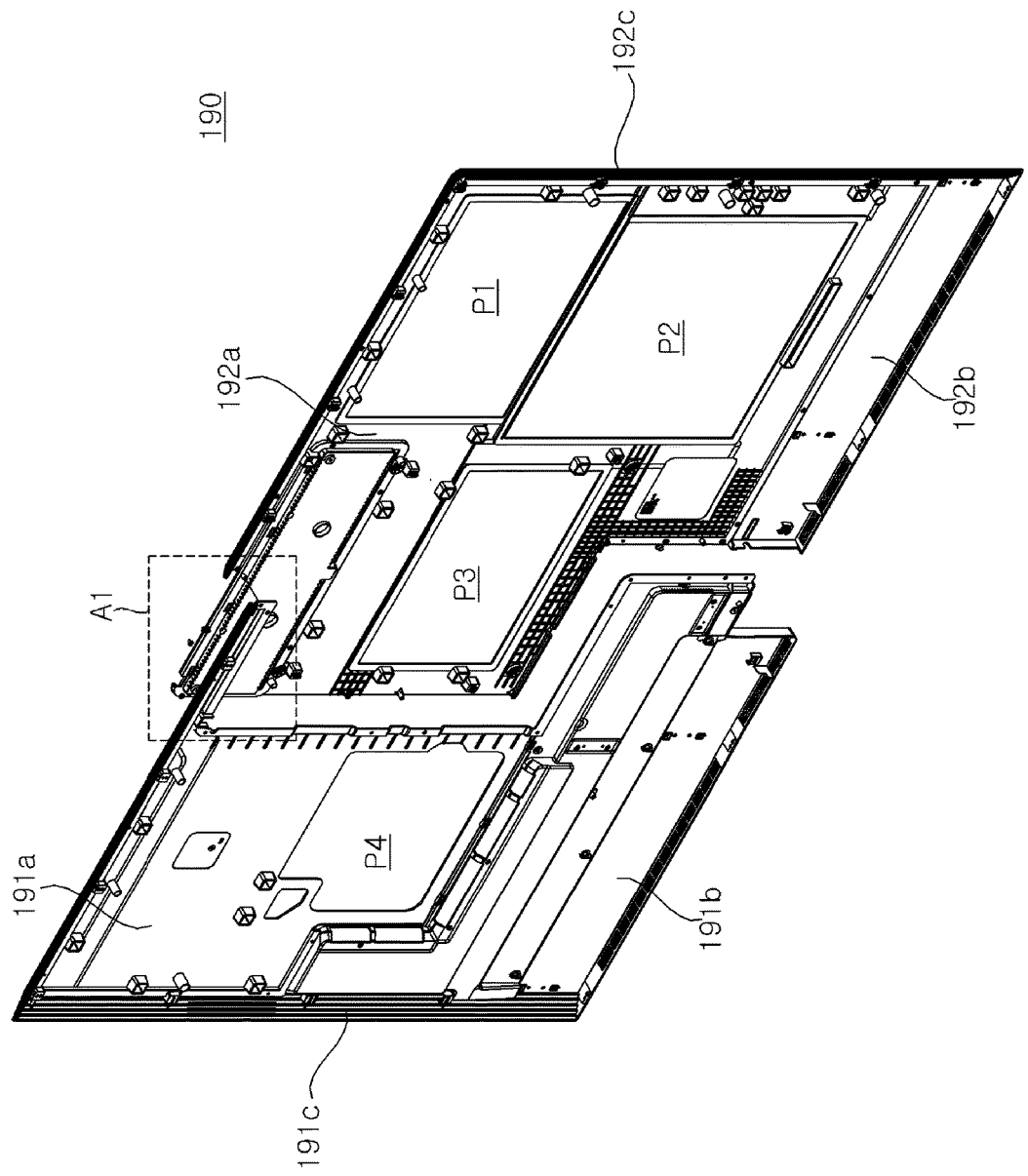
Figure 25:
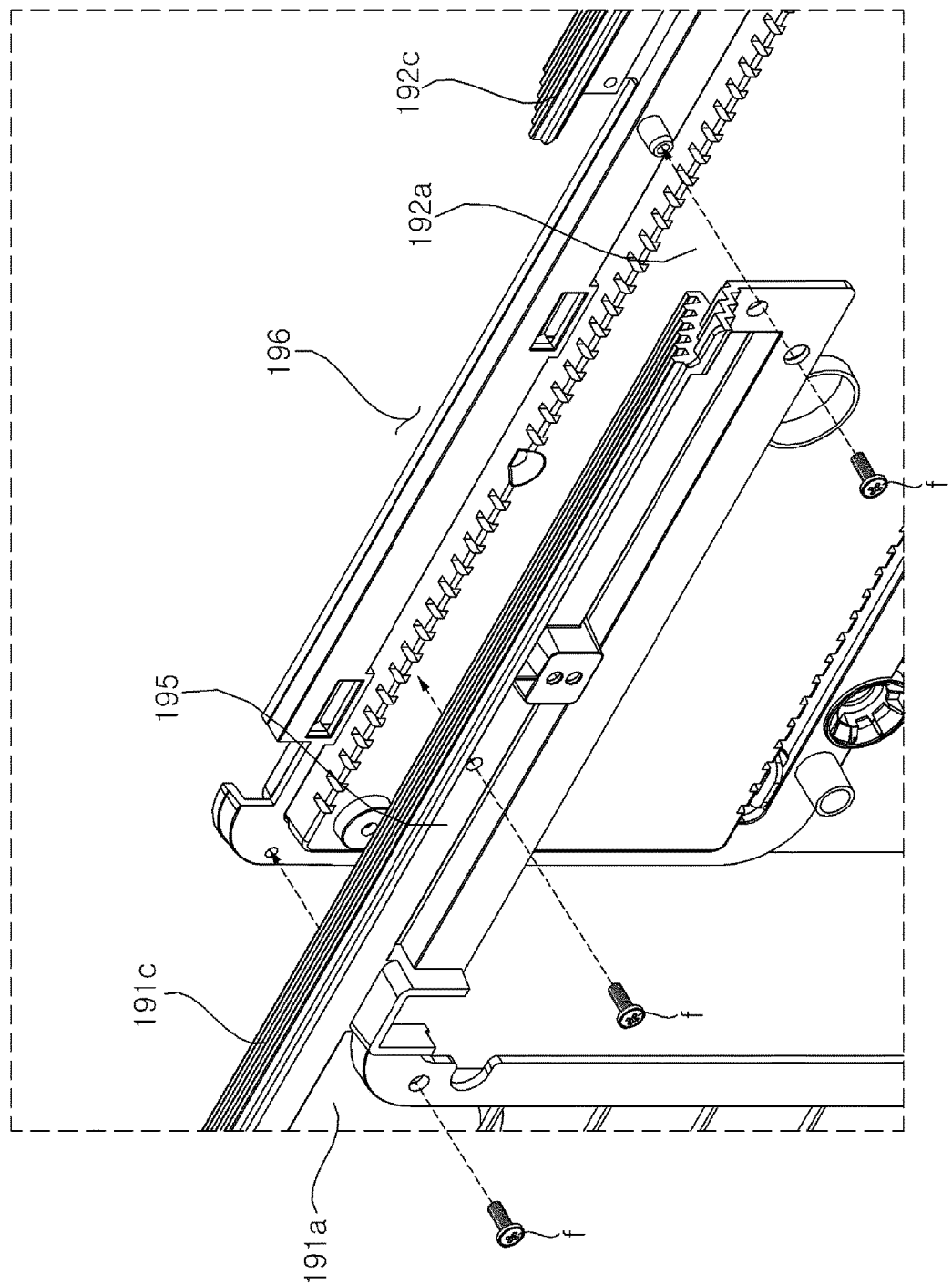

Referring to FIGS. 24 and 25, a connection portion 195 may extend long in the left-right direction from the upper end of the first part 191a of the first piece 191. The third part 191c of the first piece 191 may cover the upper side of the connection portion 195. The connection portion 195 may overlap an upper end of the second part 192a of the second piece 192, so that the first piece 191 and the second piece 192 may be coupled to each other. The first piece 191 may be coupled to the second piece 192 while the connection portion 195 is coupled to the first part 192a of the second piece 192 by a fastening member f.

For a more robust coupling, a boundary area where the first piece 191 and the second piece 192 overlap may be coupled to each other by a fastening member. For example, the right side of the first part 191a of the first piece 191 may overlap with the left side of the first part 192a of the second piece 192, and may be coupled by a fastening member. For example, a portion of the upper side and the right side of the second part 191b of the first piece 191 may overlap with a portion of the lower side of the first part 192a of the second piece 192 and the left side of the second part of the second piece 192, and may be coupled by a fastening member.

Figure 26:
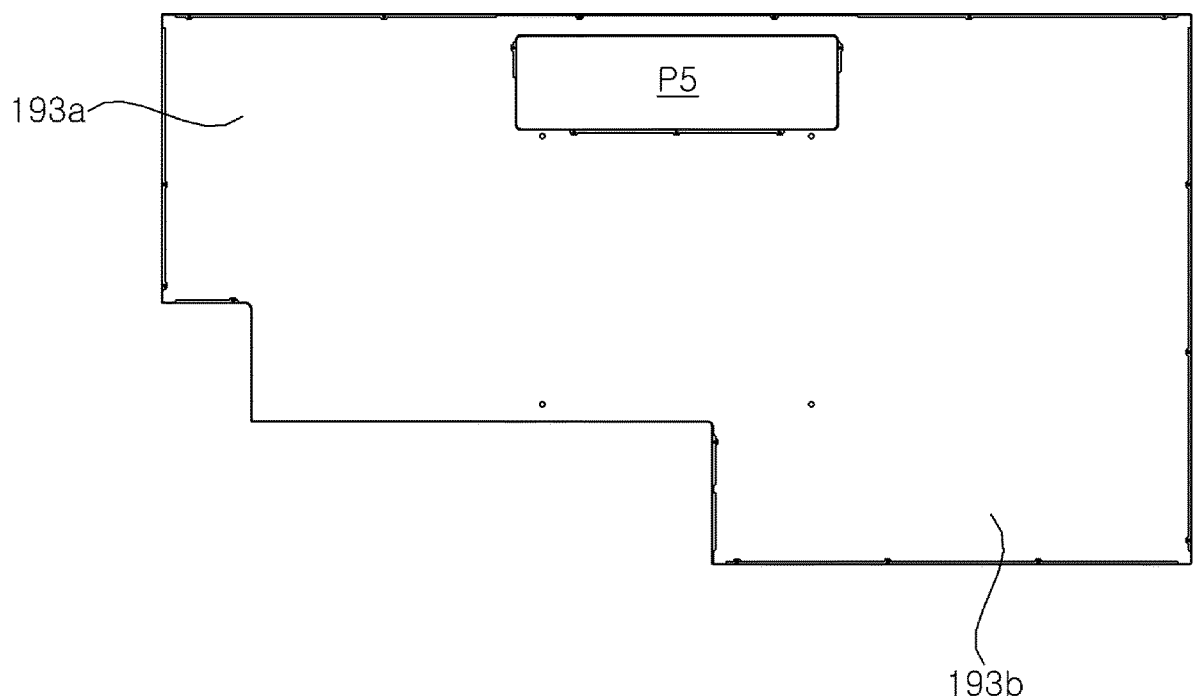
Figure 27:
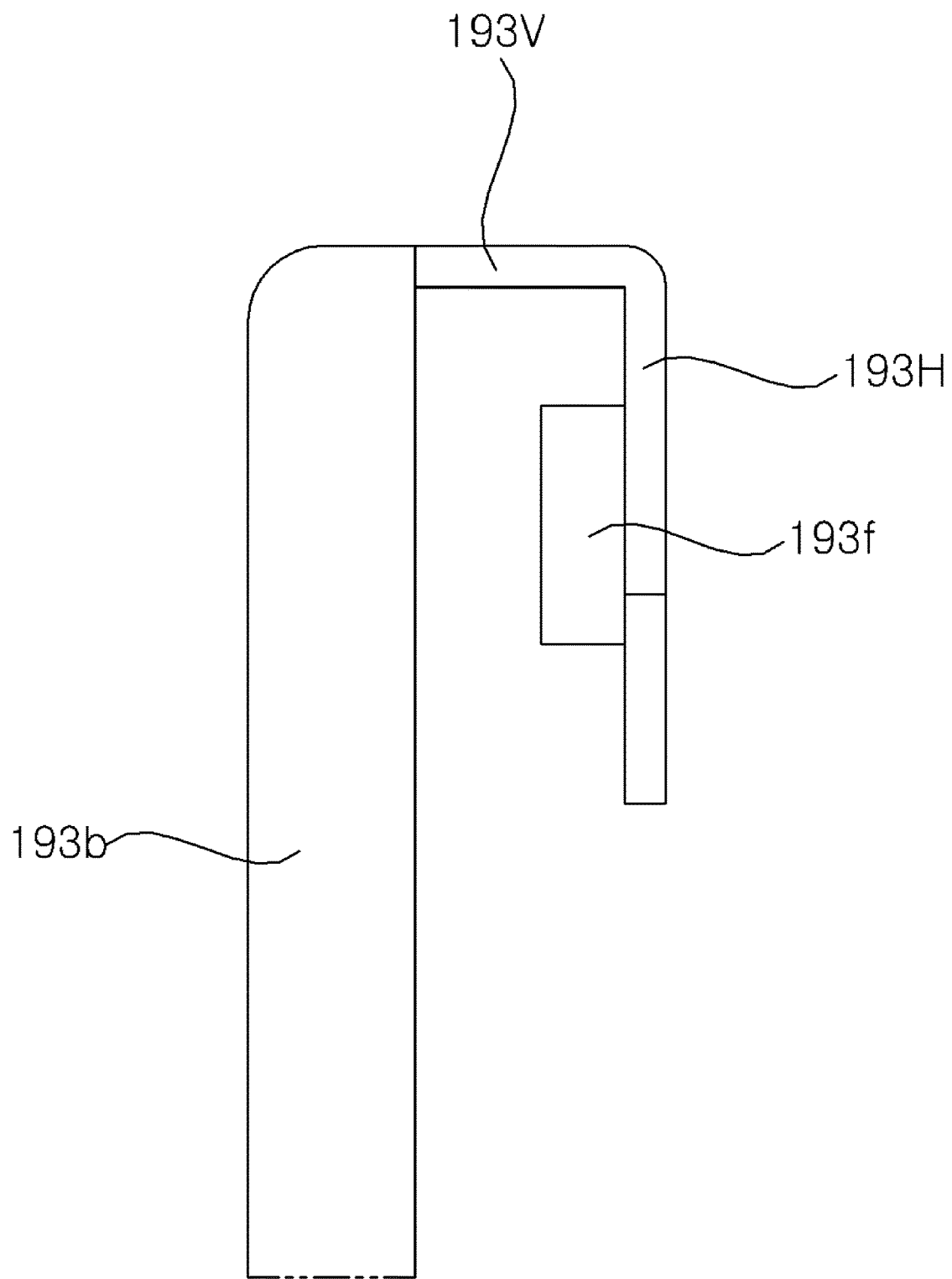

Referring to FIGS. 26 and 27, the third piece 193 may include a first part 193a and a second part 193b. The first part 193a may cover the rear surface of the first piece 191 (refer to FIG. 21). The second part 193b may cover the rear surface of the second piece 192. The fifth opening P5 may be formed throughout the first part 193a and the second part 193b. The third piece 193 may have sides that are bent.

The third piece 193 may include a flat portion 193a, 193b, a bending portion 193V, 193H, and a fastening hole 193f. The flat portion 193a, 193b may include a first part 193a and a second part 193b. The bending portion 193V, 193H may be formed by bending edges of the flat portion 193a, 193b. The bending portion 193V, 193H may include a vertical portion 193V and a horizontal portion 193H. The vertical portion 193V may extend from the edges of the flat portion 193a, 193b in the thickness direction of the flat portion 193a, 193b. The horizontal portion 193H may extend from the vertical portion 193V in the width direction of the flat portion 193a, 193b. The horizontal portion 193H may face the rear surface of the flat portion 193a, 193b, and the vertical portion 193V may connect the flat portion 193a, 193b and the vertical portion 193V. The fastening hole 193f may be formed in the horizontal portion 193H.

Figure 28:
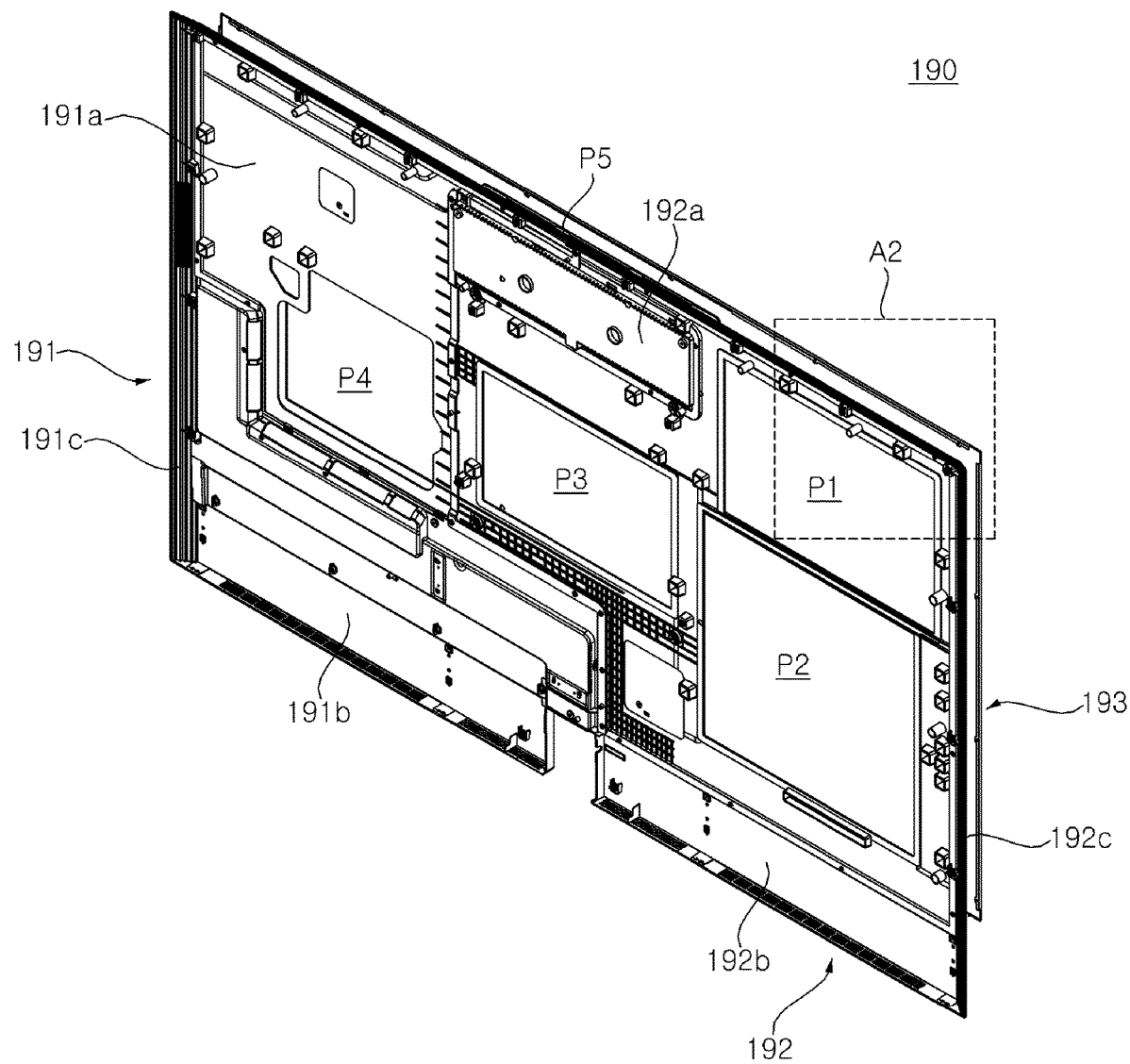
Figure 29:
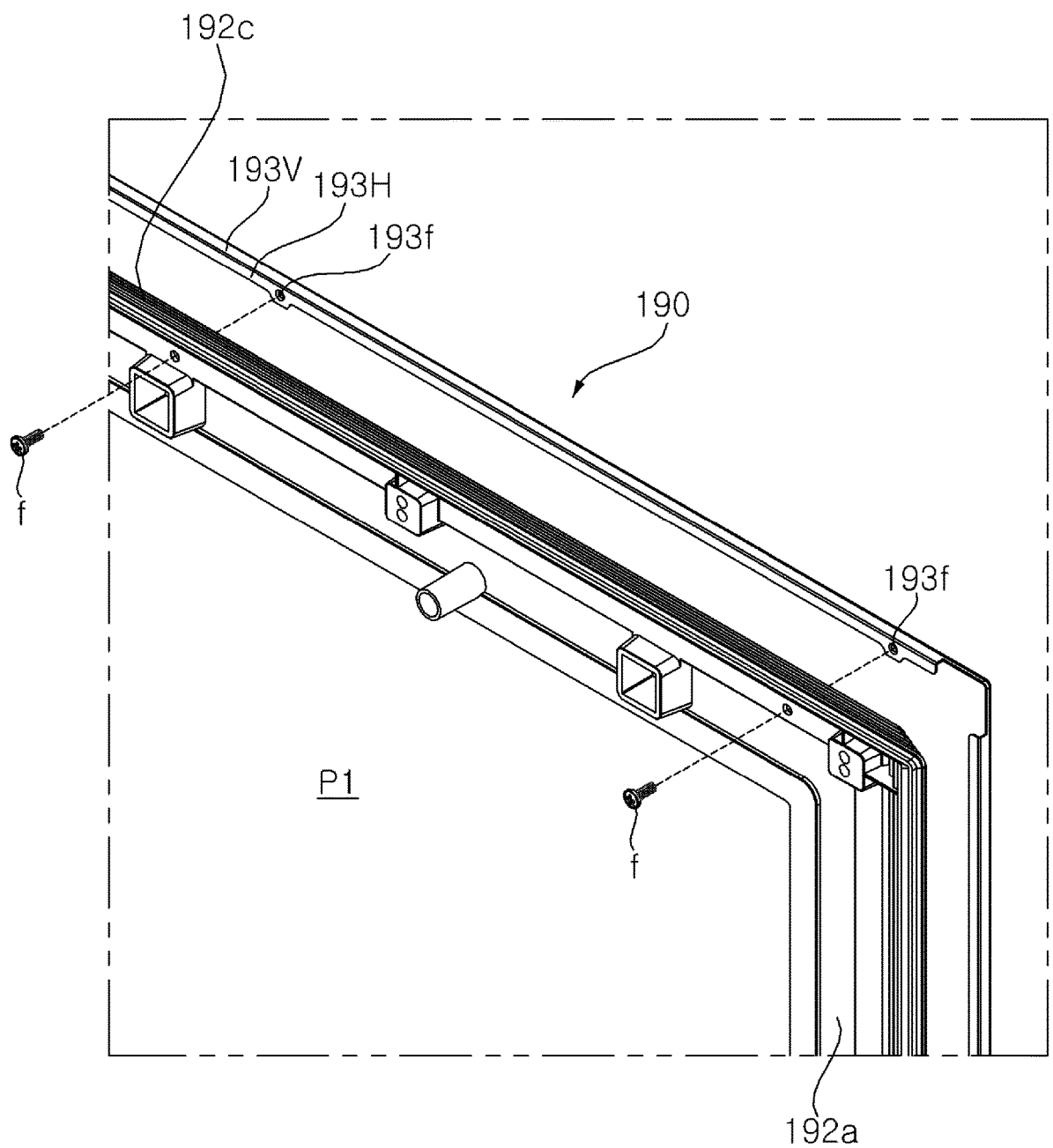

Referring to FIGS. 28 and 29, the third piece 193 may be coupled to the first piece 191 and/or the second piece 192.

The third piece 193 may be coupled to the first piece 191 and/or the second piece 192 while the fastening holes 193f facing the rear surface of the third piece 193 are fixed to the first piece 191 and/or the second piece 192. The fastening member f may be fixed to the fastening hole 193f of the third piece 193 while penetrating the first piece 191 and/or the second piece 192. The third piece 193 may cover the fourth opening P4 of the first piece 191. The third piece 193 may cover the first opening P1, the second opening P2, and the third opening P3 of the second piece 192.

Figure 30:
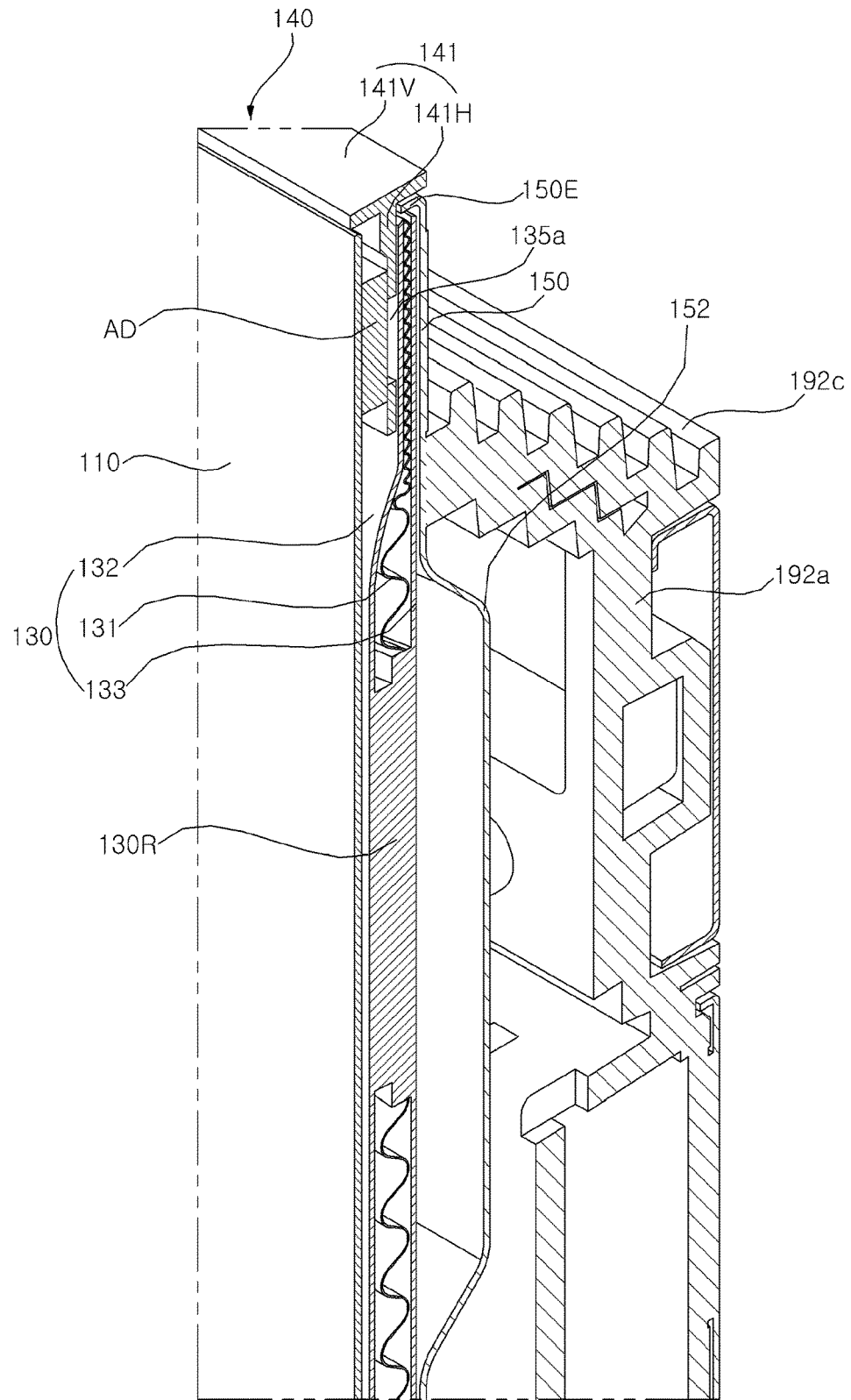

Referring to FIG. 30, the corrugate panel 130 may include a front skin 132, a core 131, and a rear skin 133. The circumference of the corrugate panel 130 may be press-processed to compress the core 131, and the front skin 132 may be recessed to form a compression portion 135a. The horizontal portion 141H of the side frame 140, 141 may be fixed to the compression portion 135a of the corrugate panel 130. The adhesive member AD may be fixed to the horizontal portion 141H of the side frame 140, 141, and the display panel 110 may be coupled to the side frame 140, 141 by the adhesive member AD.

The module cover 150 may be coupled to the corrugate panel 130 in the rearward direction of the corrugate panel 130. The edge of the module cover 150 may be bent to cover the side surface of the corrugate panel 130. A bending portion 150E of module cover 130 which is implemented by bending an edge may be located between the vertical portion 141V of the side frame 140, 141 and the side surface of the corrugate panel 130. The vertical portion 141V of the side frame 140, 141 may cover the side surface of the display panel 110, and may cover both the side surface of the corrugate panel 130 and the bending portion 150E of the module cover 150.

A rigid bar 130R may be located inside the corrugate panel 130. The rigid bar 130R may be formed between the front skin 132 and the rear skin 133. The rigid bar 130R may extend long in the left-right direction of the corrugate panel 130. Accordingly, bending rigidity and/or torsional rigidity of the corrugate panel 130 may be further improved. The horizontal rigid portion 152 of the module cover 150 may be located or may overlap in the rearward direction of the rigid bar 130R of the corrugate panel 130. Accordingly, the rigidity of the display device may be further improved.

Figure 31:
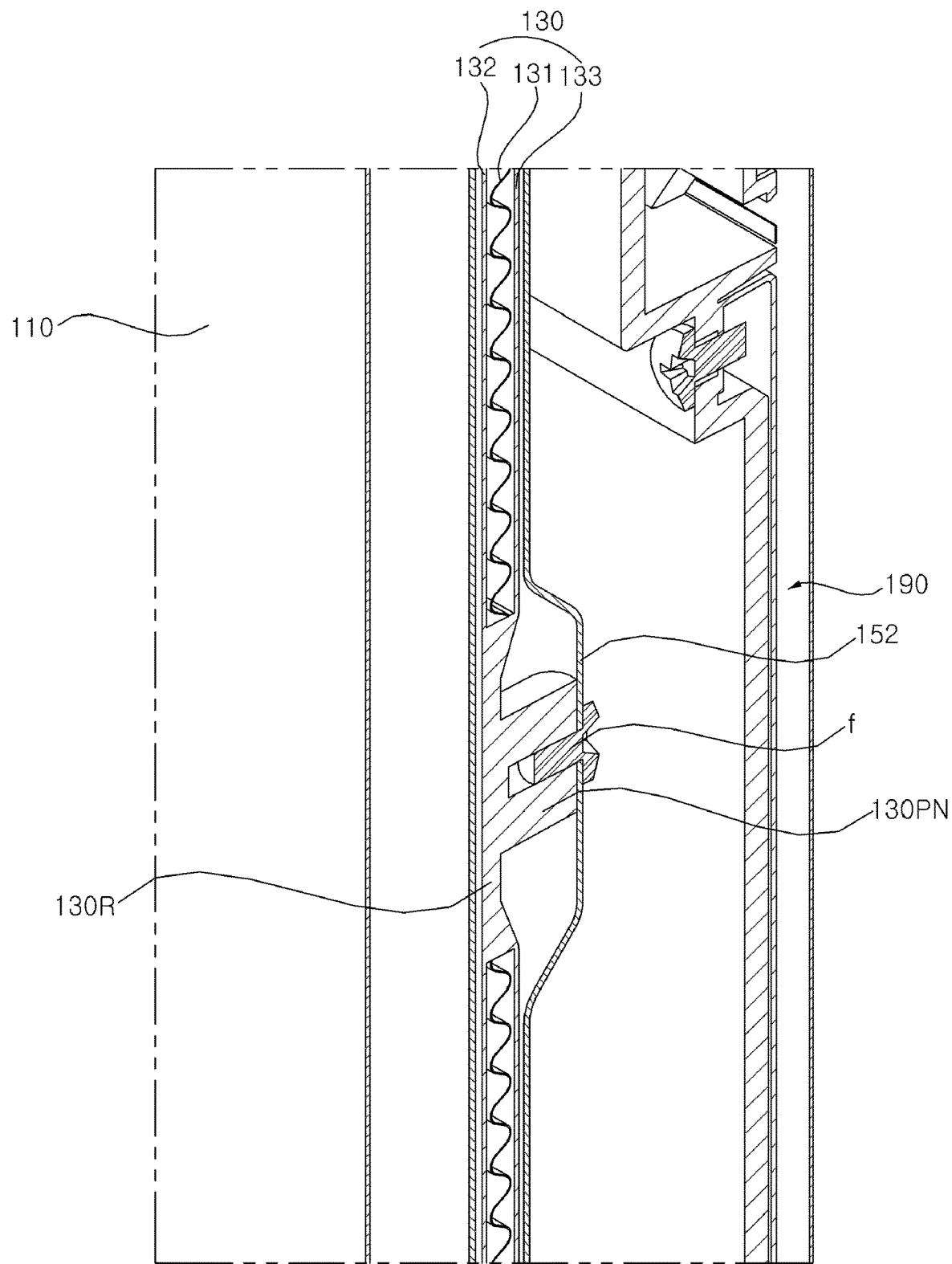

Referring to FIG. 31, the corrugate panel 130 may include a front skin 132, a core 131, and a rear skin 133. The rigid bar 130R may be located inside the corrugate panel 130. The rigid bar 130R may be formed between the front skin 132 and the rear skin 133. The rigid bar 130R may extend long in the left-right direction of the corrugate panel 130. The horizontal rigid portion 152 of the module cover 150 may be located or may overlap in the rearward direction of the rigid bar 130R of the corrugate panel 130.

A coupling portion 130PN may be formed on the rear surface of the corrugate panel 130. For example, the coupling portion 130PN may be a pemnut. The coupling portion 130PN may be connected to the rigid bar 130R. The fastening member f may penetrate the horizontal rigid portion 152 of the module cover 150 and may be inserted into the coupling portion 130PN. For example, the fastening member f may be a screw. Accordingly, the coupling between the corrugate panel 130 and the module cover 150 may be made more robust.

Figure 32:
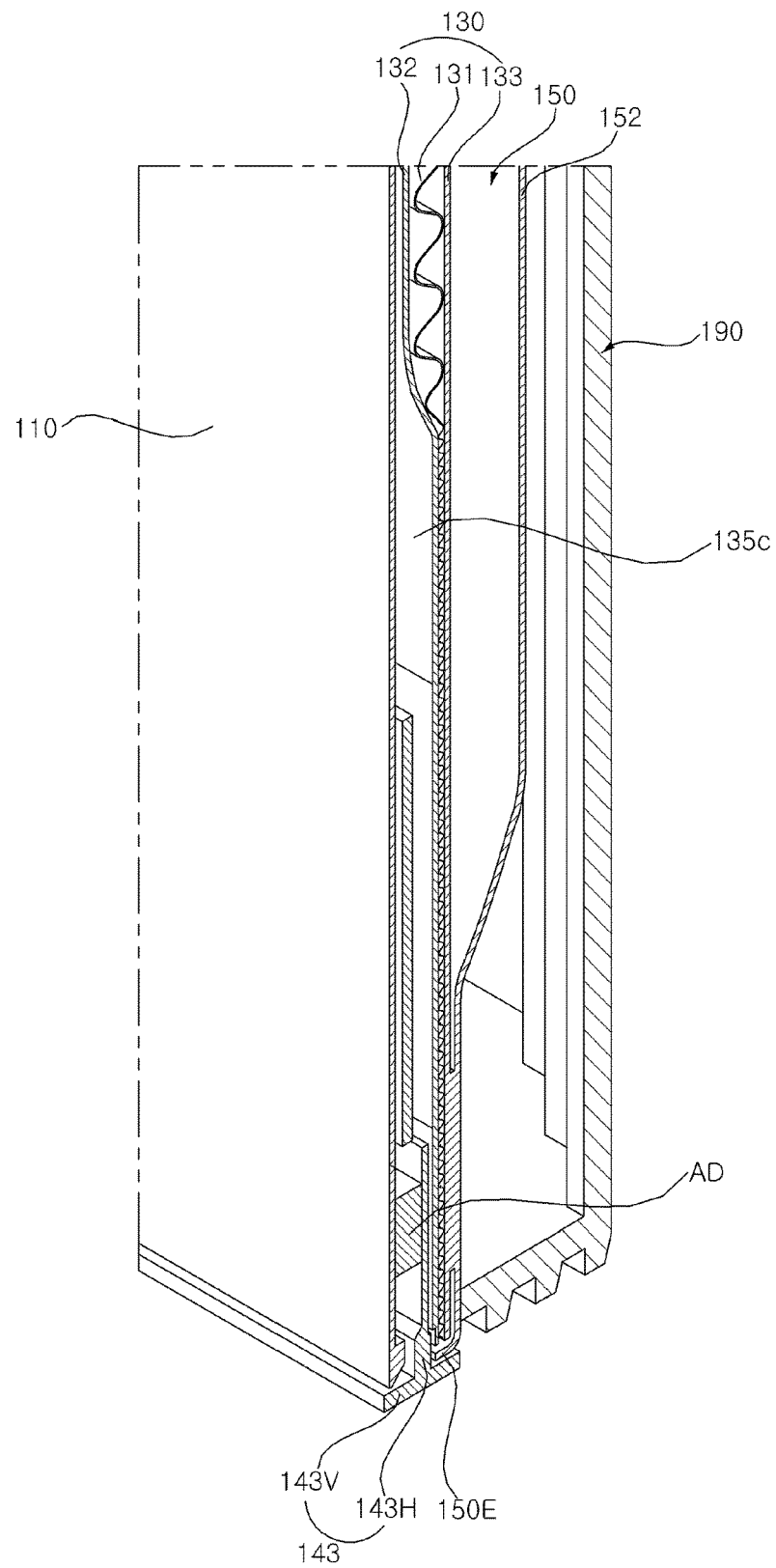

Referring to FIG. 32, the corrugate panel 130 may include a front skin 132, a core 131, and a rear skin 133. The circumference of the corrugate panel 130 may be press-processed to compress the core 131, and the front skin 132 may be recessed to form a compression portion 135c. The horizontal portion 143H of the side frame 140, 143 may be fixed to the compression portion 135c of the corrugate panel 130. The adhesive member AD may be fixed to the horizontal portion 143H of the side frame 140, 143, and the display panel 110 may be coupled to the side frame 140, 143 by the adhesive member AD.

The module cover 150 may be coupled to the corrugate panel 130 in the rearward direction of the corrugate panel 130. The edge of the module cover 150 may be bent to cover the side surface of the corrugate panel 130. The bending portion 150E of module cover 130 which is implemented by bending an edge may be located between the vertical portion 143V of the side frame 140, 143 and the side surface of the corrugate panel 130. The vertical portion 143V of the side frame 140, 143 may cover the side surface of the display panel 110, and may cover both the side surface of the corrugate panel 130 and the bending portion 150E of the module cover 150.

The horizontal rigid portion 152 of the module cover 150 may be located or overlap in the rearward direction of the compression portion 135c of the corrugate panel 130. Accordingly, the rigidity of the display device may be further improved.

According to an aspect of the present disclosure, a display device includes a display panel; a corrugate panel located in a rearward direction of the display panel, the corrugate panel comprising a front skin facing the display panel, a rear skin facing the front skin in a rearward direction of the front skin, and a wave-shaped core located between the front skin and the rear skin; a module cover coupled to the corrugate panel in a rearward direction of the corrugate panel; and a back cover coupled to the module cover in a rearward direction of the module cover, wherein the back cover includes: a first piece covering a portion of a rear surface of the module cover; a second piece which is adjacent to the first piece and covers a remainder of the rear surface of the module cover; and a third piece coupled to the first and second pieces in a rearward direction of the first and second pieces.

According to another aspect of the present disclosure, the first piece and the second piece include at least one opening, and the third piece blocks the at least one opening.

According to another aspect of the present disclosure, further provided is a main board coupled to the rear surface of the module cover; a T-CON board configured to be spaced apart from the main board and coupled to the rear surface of the module cover; and a power supply unit configured to be spaced apart from the main board and the T-CON board, and coupled to the rear surface of the module cover, wherein the first piece includes a first opening configured to be located in a rearward direction of the main board and expose the main board to the outside, wherein the second piece includes: a second opening configured to be located in a rearward direction of the power supply unit and expose the power supply unit to the outside; and a third opening configured to be located in a rearward direction of the T-CON board and expose the T-CON board to the outside.

According to another aspect of the present disclosure, the third piece covers the first opening, the second opening, and the third opening, and includes a metal.

According to another aspect of the present disclosure, the third piece includes: a first plate fixed to a front surface of the third piece, at a position corresponding to the first opening; and a second plate fixed to the front surface of the third piece, at a position corresponding to the third opening.

According to another aspect of the present disclosure, the first piece includes a connection portion extending long in a left-right direction at an upper side of the first piece, wherein the connection portion is coupled to an upper side of the second piece.

According to another aspect of the present disclosure, the third piece includes: a flat portion facing the first piece and the second piece; a vertical portion extending from an edge of the flat portion in a thickness direction of the flat portion; and a horizontal portion which is bent to extend from the vertical portion, and faces the flat portion.

According to another aspect of the present disclosure, the third piece further includes a fastening hole formed in the horizontal portion, wherein a fastening member is fixed to the fastening hole by penetrating the first piece or the second piece.

According to another aspect of the present disclosure, the first piece includes: a first part forming an upper portion; and, a second part forming a lower portion; wherein a width in a left-right direction of the second part of the first piece is greater than a width in a left-right direction of the first part of the first piece, wherein the second piece includes: a first part forming an upper portion; and a second part forming a lower portion, wherein a width in a left-right direction of the first part of the second piece is greater than a width in a left-right direction of the second part of the second piece.

According to another aspect of the present disclosure, the first part of the first piece overlaps the first part of the second piece, and the second part of the first piece overlaps the second part of the second piece.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
a display panel;
a corrugate panel located in a rearward direction of the display panel, the corrugate panel comprising a front skin facing the display panel, a rear skin facing the front skin in a rearward direction of the front skin, and a wave-shaped core located between the front skin and the rear skin;
a module cover coupled to the corrugate panel in a rearward direction of the corrugate panel; and
a back cover coupled to the module cover in a rearward direction of the module cover,
wherein the back cover comprises:

a first piece covering a portion of a rear surface of the module cover;
a second piece which is adjacent to the first piece and covers a remainder of the rear surface of the module cover; and
a third piece coupled to the first piece and the second piece in a rearward direction of the first piece and the second piece.

2. The display device of claim 1, wherein the first piece and the second piece comprise at least one opening, wherein the third piece blocks the at least one opening.

3. The display device of claim 2, further comprising:
a main board coupled to the rear surface of the module cover;
a T-CON board configured to be spaced apart from the main board and coupled to the rear surface of the module cover; and
a power supply unit configured to be spaced apart from the main board and the T-CON board, and coupled to the rear surface of the module cover,
wherein the first piece comprises a first opening configured to be located in a rearward direction of the main board and expose the main board to the outside,
wherein the second piece comprises:
a second opening configured to be located in a rearward direction of the power supply unit and expose the power supply unit to the outside; and
a third opening configured to be located in a rearward direction of the T-CON board and expose the T-CON board to the outside.

4. The display device of claim 3, wherein the third piece covers the first opening, the second opening, and the third opening, and comprises a metal.

5. The display device of claim 4, wherein the third piece comprises:
a first plate fixed to a front surface of the third piece, at a position corresponding to the first opening; and
a second plate fixed to the front surface of the third piece, at a position corresponding to the third opening.

6. The display device of claim 1, wherein the first piece comprises a connection portion extending long in a left-right direction at an upper side of the first piece,
wherein the connection portion is coupled to an upper side of the second piece.

7. The display device of claim 1, wherein the third piece comprises:
a flat portion facing the first piece and the second piece;
a vertical portion extending from an edge of the flat portion in a thickness direction of the flat portion; and
a horizontal portion which is bent to extend from the vertical portion, and faces the flat portion.

8. The display device of claim 7, wherein the third piece further comprises a fastening hole formed in the horizontal portion,
wherein a fastening member is fixed to the fastening hole by penetrating the first piece or the second piece.

9. The display device of claim 1, wherein the first piece comprises:
a first part forming an upper portion; and
a second part forming a lower portion,
wherein a width in a left-right direction of the second part of the first piece is greater than a width in a left-right direction of the first part of the first piece,
wherein the second piece comprises:
a first part forming an upper portion; and
a second part forming a lower portion, wherein a width in a left-right direction of the first part of the second piece is greater than a width in a left-right direction of the second part of the second piece.

10. The display device of claim 9, wherein the first part of the first piece overlaps the first part of the second piece, and the second part of the first piece overlaps the second part of the second piece.

* * * * *